US006172812B1

(12) United States Patent
Haaland et al.

(10) Patent No.: US 6,172,812 B1
(45) Date of Patent: Jan. 9, 2001

(54) ANTI-REFLECTION COATINGS AND COATED ARTICLES

(76) Inventors: Peter D. Haaland, 518 W. Linden St., Louisville, CO (US) 80027; B. Vincent McKoy, 3855 Keswick Rd., Flintridge, CA (US) 91011

(*) Notice: Under 35 U.S.C. 154(b), the term of this patent shall be extended for 0 days.

(21) Appl. No.: 09/364,748

(22) Filed: Jul. 30, 1999

Related U.S. Application Data

(63) Continuation-in-part of application No. 08/990,003, filed on Dec. 12, 1997, now Pat. No. 5,991,081.
(60) Provisional application No. 60/037,239, filed on Jan. 27, 1997.

(51) Int. Cl.[7] .................................................. G02B 5/28
(52) U.S. Cl. ................................... 359/589; 359/580
(58) Field of Search .................................. 359/589, 580, 359/581, 582, 586, 588, 590; 428/421, 422; 427/164, 165

(56) References Cited

U.S. PATENT DOCUMENTS

| 3,356,522 | 12/1967 | Libbert | 117/33.3 |
|---|---|---|---|
| 3,892,490 | 7/1975 | Uetsuki et al. | 356/161 |
| 4,058,638 | 11/1977 | Morton | 427/39 |
| 4,096,315 | 6/1978 | Kubacki | 428/412 |
| 4,130,672 | 12/1978 | Onoki et al. | 427/164 |

(List continued on next page.)

FOREIGN PATENT DOCUMENTS

| 3627248 | 4/1987 | (DE). |
|---|---|---|
| 4338040 | 5/1995 | (DE). |
| 112418 | 7/1984 | (EP). |
| 451618 | 10/1991 | (EP). |
| 1530833 | 11/1978 | (GB). |
| 04191701 | 7/1992 | (JP). |
| WO 9308489 | 4/1993 | (WO). |

OTHER PUBLICATIONS

Applied Vision; Plasma Coat Express; "Anti–Reflection Coating at the Point of Sale"; Brochure Date 1995, 4 pp.
Born, M. et al.; "Electromagnetic Theory of Propagation, Interference and Diffraction of Light", Principles of Optics; Pergamon Press, pp. 36–70, 1980.
Database WPI; Section Ch, Week 9750; Derwent Publications Ltd., JP 09 258 004; Oct. 1997.
Endo, K. et al.; "Fluorinated Amorphous Carbon Thin Films Grown from C4F8 for Multilevel Interconnections of Integrated Circuits"; NEC Research & Development, vol. 38, No. 3, pp. 287–293, Jul. 1997.
Furman, Sh. A. et al.; "Basics of Optics of Multilayer Systems"; Editions Frontieres Publication, pp. 176–183, 1992.
Gotoh, Y. et al.; "Analysis of Polymer Formation During $SiO_2$ Microwave Plasma Etching"; Jpn. J. Appl. Phys. vol. 34 (1995) pp. 2132–2136.
Groh, W. et al.; "What is the Lowest Refractive Index of an Organic Polymer?"; Macromolecules 1991, vol. 24, pp. 6660–6663.

(List continued on next page.)

Primary Examiner—Thong Nguyen
Assistant Examiner—Euncha Cherry
(74) Attorney, Agent, or Firm—Christie, Parker & Hale, LLP

(57) ABSTRACT

Coated optical substrates and a method of coating optical substrates with anti-reflective (AR) coatings are described. The composition of the coating is determined by material constraints such as adhesion, durability, ease of manufacture, and cost. The thickness of one or more layers of AR material is determined by minimizing the product of the Fresnel reflection coefficients for the coated article with the angle- and wavelength-dependent sensitivity of the human visual system. Preferred designs have a value of perceived reflectance, F, less than or equal to $1.25\ F_{min}$ where $F_{min}$ is the minimized perceived reflectance for the coated article. Coatings which have minimal perceived reflection while maintaining reflections with desired visually perceived colors are also described.

21 Claims, 17 Drawing Sheets

U.S. PATENT DOCUMENTS

| | | | |
|---|---|---|---|
| 4,166,784 | 9/1979 | Chapin et al. | 204/192 R |
| 4,172,156 | 10/1979 | Ritter et al. | 427/38 |
| 4,311,725 | 1/1982 | Holland | 427/10 |
| 4,374,158 | 2/1983 | Taniguchi et al. | 427/41 |
| 4,599,272 | 7/1986 | Ichikawa | 428/412 |
| 4,632,844 | 12/1986 | Yanagihara et al. | 427/38 |
| 4,676,646 | 6/1987 | Strand et al. | 356/381 |
| 4,815,962 | 3/1989 | Cardone | 427/38 |
| 4,830,873 | 5/1989 | Benz et al. | 427/35 |
| 4,837,044 | 6/1989 | Murarka et al. | 427/10 |
| 4,842,941 | 6/1989 | Devins et al. | 428/412 |
| 4,906,844 | 3/1990 | Hall | 250/225 |
| 5,053,244 | 10/1991 | Kieser et al. | 427/38 |
| 5,093,152 | 3/1992 | Bonet et al. | 427/40 |
| 5,171,414 | 12/1992 | Amberger et al. | 204/192.26 |
| 5,181,141 | 1/1993 | Sato et al. | 359/580 |
| 5,181,142 | 1/1993 | Asai et al. | 359/581 |
| 5,225,057 | 7/1993 | LeFebvre et al. | 204/192.13 |
| 5,225,244 | 7/1993 | Aharoni et al. | 427/240 |
| 5,246,782 | 9/1993 | Kennedy et al. | 428/421 |
| 5,264,724 | 11/1993 | Brown et al. | 257/347 |
| 5,354,575 | 10/1994 | Dagenais et al. | 427/10 |
| 5,403,433 | 4/1995 | Morrison et al. | 156/626 |
| 5,415,927 | 5/1995 | Hirayama et al. | 428/307.3 |
| 5,425,964 | 6/1995 | Southwell et al. | 427/10 |
| 5,443,941 | 8/1995 | Bariya et al. | 430/313 |
| 5,449,558 | 9/1995 | Hasegawa et al. | 428/422 |
| 5,476,717 | 12/1995 | Floch | 428/421 |
| 5,494,697 | 2/1996 | Blayo et al. | 427/10 |
| 5,541,770 | 7/1996 | Pellicori et al. | 359/585 |
| 5,580,606 | 12/1996 | Kai | 427/164 |
| 5,597,609 | 1/1997 | Beisswenger et al. | 427/8 |
| 5,728,456 | 3/1998 | Adair et al. | 428/216 |
| 5,772,861 | 6/1998 | Meridith, Jr. et al. | 204/298.03 |
| 5,789,040 | 8/1998 | Martinu et al. | 427/575 |
| 5,911,856 | 6/1999 | Suzuki et al. | 204/192.13 |
| 5,991,081 * | 11/1999 | Haaland et al. | 359/589 |

OTHER PUBLICATIONS

Japanese Patent Abstract, Publication No. 01238601, Publication Date Sep. 1989.

Japanese Patent Abstract, Publication No. 04191701, Publication Date Jul. 1992.

Japanese Patent Abstract, Publication No. 08017743, Publication Date Jan. 1996.

Japanese Patent Abstract, Publication No. 57026702, Publication Date Feb. 1982.

Japanese Patent Abstract, Publication No.58072103, Publication Date Apr. 1983.

Macleod, H.A.; "Anti–Reflection Coatings"; Thin–Film Optical Filters; Chapter 3, pp. 70–136, 1986.

Macleod, H.A.; "Appendix Characteristics of Thin–Film Materials"; Thin–Film Optical Fibers; 2nd edition, pp. 504–511, 1986.

Macleod, H.A.; "Production Methods and Thin–Film Materials"; Thin–Film Optical Filters; Chapter 9, pp. 357–411, 1986.

Seferis, J.; "Refractive Indices of Polymers"; Polymer Handbook 3rd ed., Brandrup et al, editors; vol. I, pp. 451–461, 1975.

Wade, N. et al.; "Visual Perception, An Introduction"; Routledge Publication; pp. 45–63, 1991.

Wandell, B.A.; "The Photocepter Types", Foundations of Vision Science, Library of Congress Cataloging–in–Publication Data, ISBN 0–87893–853–2, 1995.

Wydeven, T. et al.; "Antireflection Coating Prepared by Plasma Polymerization of Perfluorobutene–2"; Applied Optics, vol. 15, No. 1, pp. 132–136, Jan. 1976.

Wyszecki, G. et al.; "Concepts and Methods, Quantitative Data and Formulae"; Color Science; A Wiley–Interscience, Publication, pp. 392–420, 1982.

* cited by examiner

ANTI-REFLECTION COATINGS AND COATED ARTICLES

CROSS-REFERENCE TO RELATED APPLICATION

This application is a continuation in part of U.S. application Ser. No. 08/990,003 filed Dec. 12, 1997, now U.S. Pat. No. 5,991,081, and claims priority of Provisional U.S. Patent application Ser. No. 60/037,239, filed Jan. 27, 1997, the contents of both applications being fully incorporated by reference herein.

BACKGROUND OF THE INVENTION

The present invention generally relates to improving the transmission of light through optical materials, such as spectacle lenses and, at the same time, reducing reflection of stray light that leads to glare from optical materials. The invention further relates to controlling the perceived color of light reflected from the surface of optical materials.

All uncoated, optically transparent materials reflect a portion of incident light. The amount of reflection varies with the wavelength, polarization, and angle of incidence of the light as well as the wavelength-dependent refractive index, n, of the material. This Fresnel reflection is described by Maxwell's equations for electromagnetic radiation, as known to those practiced in the art of optics and described, for example, by M. Born and E. Wolf in *Principles of Optics*, New York, Pergammon Press (1980). It is also known that layers of transmissive materials with refractive indices different from that of the substrate can reduce the amount of reflection. The amount of this reduction depends on the wavelength-dependent refractive index of the coating materials and their thickness as well as the wavelength, polarization, and angle of incidence of the light. The design and manufacture of these anti-reflection (AR) coatings is thoroughly described in Chapters 3 and 9 of H. A. McLeod, *Thin Film Optical Filters*, New York, McGraw-Hill (1989).

The sensitivity of the human visual system also varies with the wavelength of light and the angle with which it enters the eye, as described, for example, in Color Science: *Concepts and Methods, Quantitative Data and Formulae* by Gunter Wyszecki and W. S. Stiles (New York:Wiley) (1982) and Visual Perception by Nicholas Wade and Michael Swanston (London:Routledge) (1991). A problem therefore is to choose the coating thickness and composition so that the angular and wavelength variation of Fresnel reflection from the coated article as perceived by the human visual system is minimized.

Known AR coatings use one or more thin layers of inorganic oxides, nitrides, or fluorides to achieve a reduction in reflection. Common thin-film materials used for such AR coatings are described in chapter 9 and Appendix I of Mcleod and include oxides of Al, Sb, Be, Bi, Ce, Hf, La, Mg, Nd, Pr, Sc, Si, Ta, Ti, Th, Y, and Zr. Mcleod's tabulation also includes fluorides of Bi, Ca, Ce, Al, La, Na, Pb, Li, Mg, Nd, Na, and Th, as well as a few sulphides and selenides. A similar tabulation is found in table 4.1 on page 179 of *Optics of Multilayer Systems* (Sh. A. Furman and A. V. Tikhonravov, Editions Frontieres:Gif-sur Yvette Cedex-France, 1992). The number of layers and their compositions are generally chosen based on auxilliary constraints including hardness or scratch resistance, adhesion, durability, ease of deposition, cost, and other factors familiar to those practiced in the art of optical coatings. However the layer thicknesses are generally adjusted to minimize the proportion of incident light that is reflected (reflectance) at normal incidence and one or more specified wavelengths. A problem therefore is to choose a set of layer thicknesses that minimize or significantly reduce the amount of reflected light that can be perceived by the human visual system over all relevant angles and wavelengths.

As described above, the amount of reflectance from a coated article varies with angle and wavelength. When uncoated spectacle lenses are worn, a person looking at the wearer perceives a reflection of light from the environment, i.e., "glare." The color of this reflection is, for uncoated lenses, typically that of the ambient light source(s) because the variation of reflection with wavelength from an uncoated spectacle is quite small. This result is generally true for mildly dispersive optical materials such as glass, polycarbonate, polymethylmethacrylate, and other spectacle lens materials. A plot of the wavelength and angle dependent reflectance for glass is shown in FIG. 1.

The amount of reflected light from an AR coated article varies more dramatically with wavelength and angle, so that the perceived color of the reflection may differ from that of the light source. As this color influences the cosmetic quality of a spectacle lens, and other optical substrates, it is therefore, desirable to reduce reflection while controlling the perceived color of reflected light.

SUMMARY OF THE INVENTION

In accordance with the present invention, an anti-reflection (AR) coating is designed using the wavelength and angle dependent refractive properties of one or more thin layers on an optical substrate. The number and ordering of the layers is determined by non-optical constraints such as adhesion, durability, cost, ease of deposition, and the like. A perceived reflectance, F, which weights the angle- and wavelength-dependent Fresnel reflectance by the angle and wavelength sensitivity of the human visual system, is computed for each combination of layer thicknesses. In one embodiment, the value of F is calculated to obtain a minimum value unique to the combination of optical substrate and layers of coated material, for any specified viewing conditions. In an alternative embodiment, the thicknesses of the one or more layers of material are such that perceived reflectance of the coated substrate is not completely minimized, but is close to, and preferably within 25% of the minimum value of F, for the specified viewing conditions. The advantage of this approach is that one obtains a coated substrate having the absolute lowest value of perceived reflectance over a range of wavelengths and angles for a given geometry of viewing conditions. Alternatively, where absolute minimization is not required, perceived reflectance is reduced to within 25% or less of the minimum value—still far lower than the value of perceived reflectance otherwise obtainable.

In one embodiment of the invention, the layer or layers (also referred to as "coatings" or "films") are formed by plasma-enhanced chemical vapor deposition (PECVD) of volatile precursors, non-limiting examples of which include organic and organometallic compounds. Alternatively, one or more layers are formed by sputtering or evaporation, using techniques and materials well known in the art. The McLeod reference provides a good description of such techniques and materials. The resulting layers may be optically dispersive (i.e., have a variation of refractive index with wavelength). Alternatively, the resulting layer(s) may not be optically dispersive. The layers have refractive properties that depend on the precursor, the deposition conditions, and the film thickness. Both single and multiple layer AR coatings are prepared in this manner.

A further aspect of the present invention is the control of the perceived color of light reflected by the coated article. For each set of film thicknesses the color perceived by reflection of standard illuminants, (e.g. daylight, fluorescent, incandescent, or arc lamps) is computed using standard colorimetric methods. The perceived color and its variation with angle are then used as constraints while the perceived reflectance is minimized. This process leads to a coated article that exhibits a minimum perceived reflectance (or a value within 25% or less of minimum) of desired color.

BRIEF DESCRIPTION OF THE DRAWINGS

These and other features and advantages of the present invention will be better understood by reference to the following detailed description when considered in conjunction with the accompanying drawings, wherein.

DESCRIPTION OF THE PREFERRED EMBODIMENTS

Figure 1:
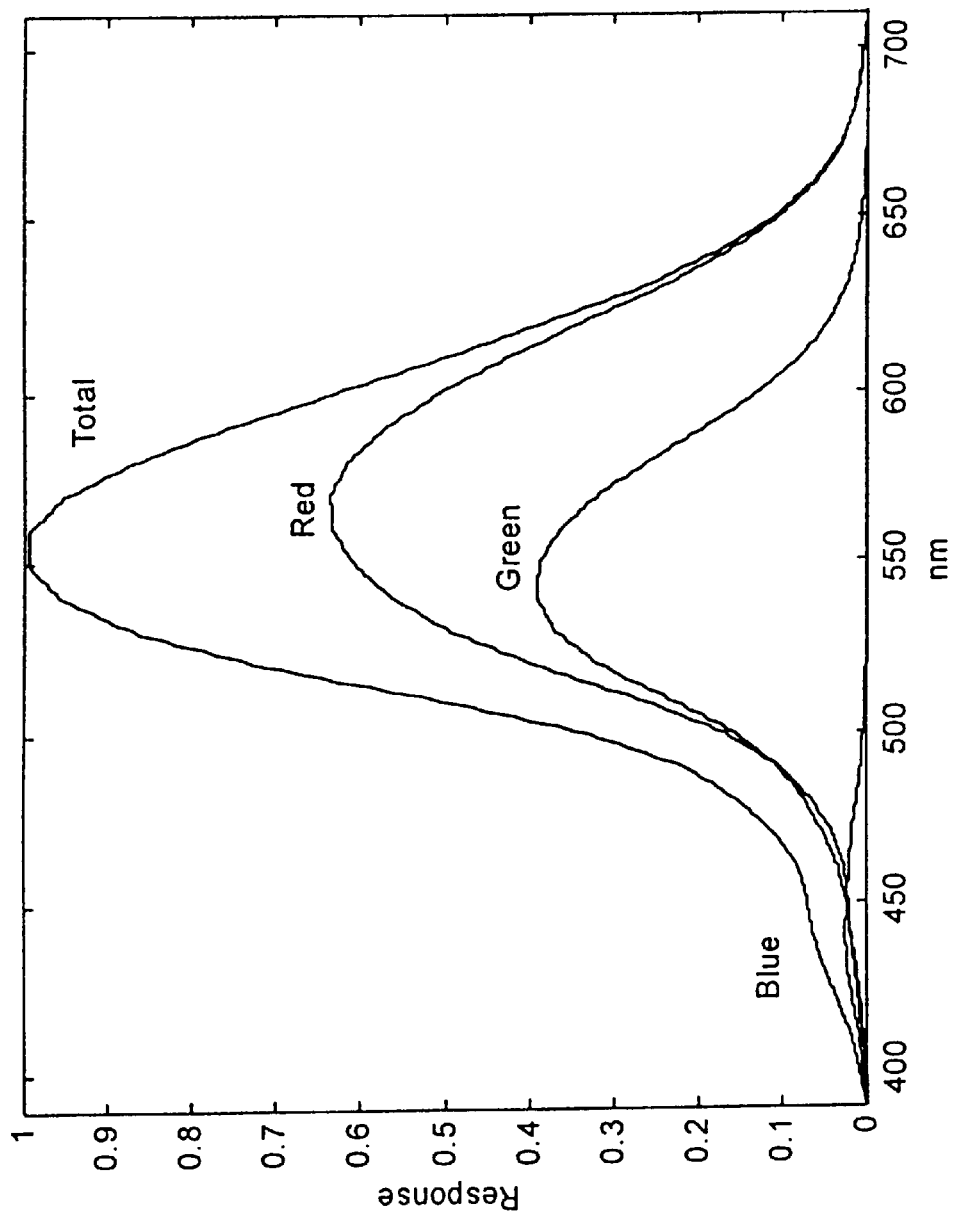
FIG. 1 is a plot of the human photopic response showing the total sensitivity as well as the response for sets of cone cells with red, green, and blue photoreceptors, after Wyszecki and Stiles, Table 3.1.1. The scotopic (rod-photoreceptor) response curve has its maximum 49 nm to the blue (507 nm) and has a full width at half maximum of 100 nm.

The present invention provides new, single and multilayer AR coatings on optical substrates. As used herein, the terms "optical materials," "optical substrates," and "optical articles" refer to normally transparent or translucent materials such as glass and plastic, and articles made of such materials. Nonlimiting examples of such articles include lenses, windows, television and computer monitor screens, and automotive windshields.

Reflectance, R, is the ratio of the intensity of the reflected portion of light, $I_r$, to the intensity of the incident probe light, $I_i$:

$$R(\lambda, \theta, P) = \frac{I_r}{I_i} = \rho\rho^* = \frac{|y_0 - y_i|^2}{|y_0 + y_i|^{2*}} \quad (1)$$

The reflectance varies with the wavelength of light, λ, the angle of incidence, θ, and the light's polarization P. It is equal to the product of the Fresnel reflection coefficient, ρ, and its complex conjugate ρ*, which can also be expressed in terms of optical admittances for the substrate medium $y_o$ and the incident medium $y_i$. The optical admittance is $$y=2.6544\times10^{-3}(n-ik)=(C/B) \quad (2)$$

where n is the real part of the refractive index, k is the absorptive (imaginary) part of the refractive index, and the constant is a conversion factor for SI units. The optical admittance when one or more thin layers is added to a substrate whose admittance is $\eta_m$ becomes $$y = (C/B)$$

where C and B are computed by solving the matrix equation (3)

$$\begin{bmatrix} B \\ C \end{bmatrix} = \left( \prod_{r=1}^{q} \begin{bmatrix} \cos\delta_r & (i\sin\delta_r)/\eta_r \\ i\eta_r\sin\delta_r & \cos\delta_r \end{bmatrix} \begin{bmatrix} 1 \\ \eta_m \end{bmatrix} \right) \quad (3)$$

In equation (3) the argument of the trigonometric functions for each layer r whose physical thickness is $d_r$ is $$\delta_r=2\pi(n-ik)d_r\cos(\theta_r)/\lambda, \quad (4)$$

At normal incidence, ($\theta=0$), the admittance is the same for any polarization. At other angles of incidence one splits the incident wave into two polarizations, p and s, and defines tilted optical admittances $$\eta_p=2.6544\times10^{-3}(n-ik)/\cos(\theta)$$

$$\eta_s=2.6544\times10^{-3}(n-ik)\times\cos(\theta) \quad (5)$$

leading to general reflectance R, transmission T, and absorption A via the formulae:

$$R = \left(\frac{\eta_0 B - C}{\eta_0 B + C}\right)\left(\frac{\eta_0 B - C}{\eta_0 B + C}\right)^* \quad (6)$$

$$T = \frac{4\eta_0 \text{Re}(\eta_m)}{(\eta_0 B + C)(\eta_0 B + C)^*}$$

$$A = \frac{4\eta_0 \text{Re}(BC^* - \eta_m)}{(\eta_0 B + C)(\eta_0 B + C)^*}$$

where the subscripts 0 and m refer to the incident medium and substrate, respectively. The derivation of these equations is described in chapter 1 by H. A. McLeod, op.cit.

The sensitivity of human vision varies both with optical wavelength and angle of incidence as discussed, for example in *Color Science: Concepts and Methods, Quantitative Data and Formulae* by Gunter Wyszecki and W. S. Stiles (New York:Wiley) (1982) and *Visual Perception* by Nicholas Wade and Michael Swanston (London:Routledge) (1991). It is not, however, sensitive to polarization.

The variation of human visual sensitivity with wavelength, $S(\lambda)$, is graphically presented in FIG. 1, which shows the sensitivity for each cone pigment (nominally red, green, and blue), as well as the sum of the cone responses. This sum is referred to as the photopic response.

Figure 2A:
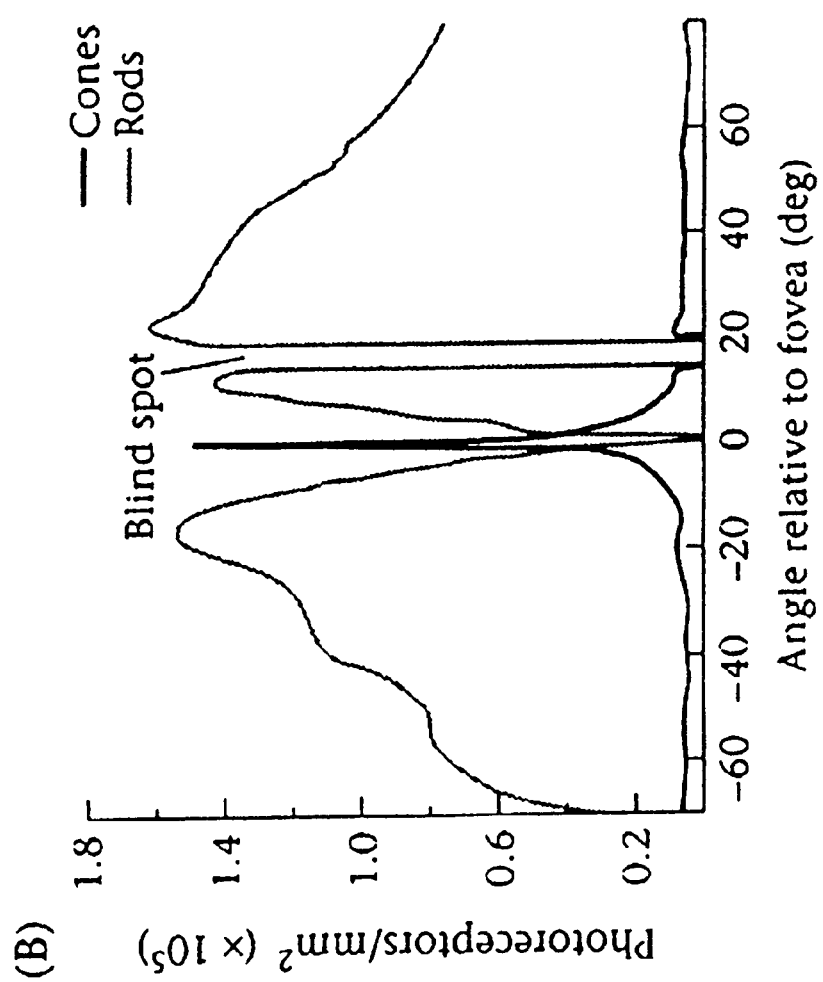
FIG. 2(a) is a plot of the angular variation of cone and rod photoreceptors in a human eye taken from Wandell, op.cit., FIG. 3.1b, page 46. The photopic (cone) response is responsible for color vision and is active at moderate to bright illumination levels. Scotopic vision is dominated by rod photoreceptors and is active only at low light levels (night vision). These factors are combined with the geometry of the viewing situation to yield the angular part of $S(\lambda,\theta)$.
Figure 2B:
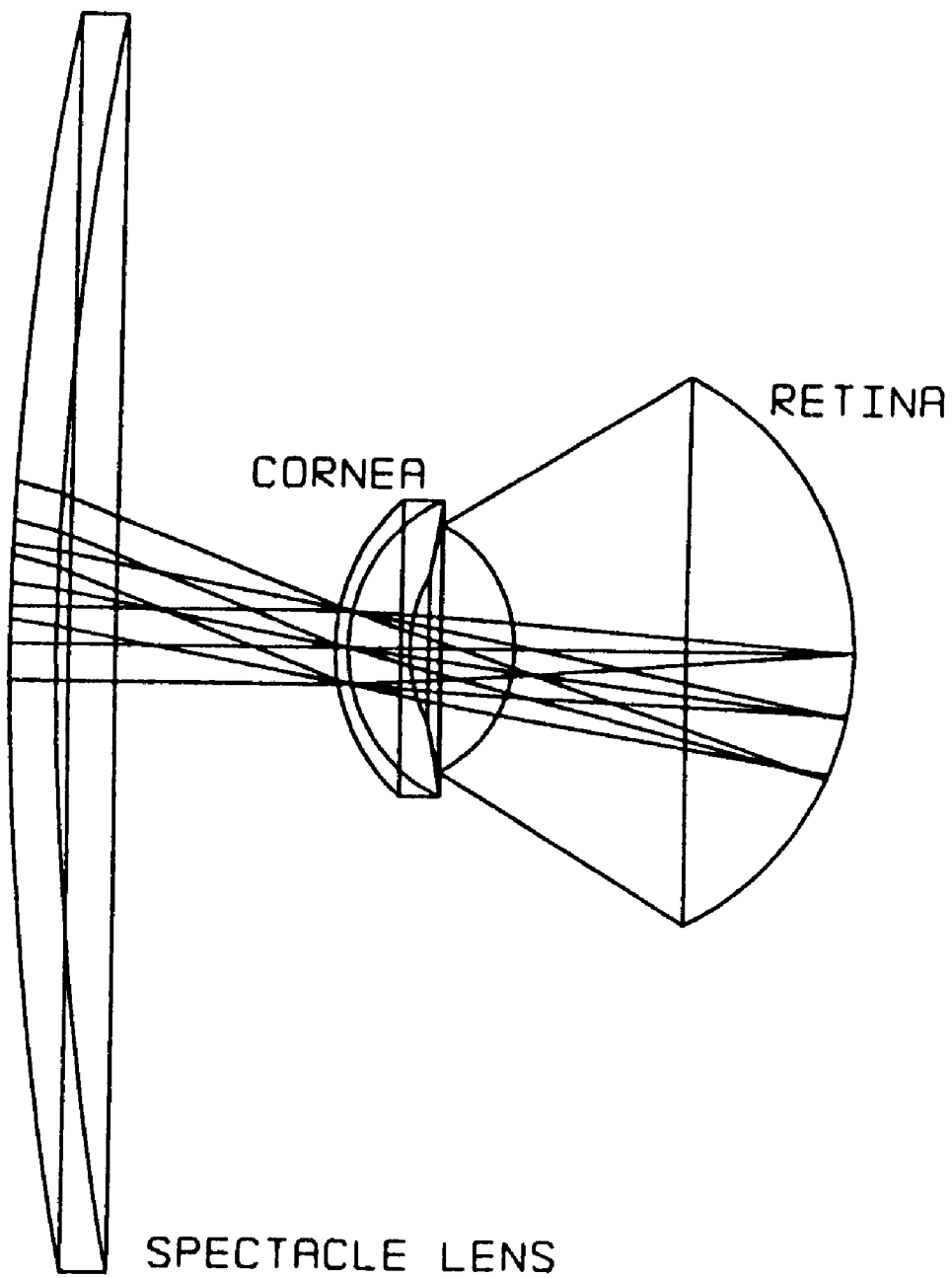
FIG. 2(b) is a schematic view of the geometry for viewing through spectacle lens. The 8 dioptre piano lens is 12 mm from the surface of the cornea. Rays that travel from left to right impinge on the cornea at 0 (blue), 10 degrees (green) and 20 degrees (red) are shown propagating through a 3 mm diameter pupil and onto the retina. Note that 20 degree rays normally impinge on regions of the retina for which the cone sensitivity is low. The eye therefore rotates in its orbit by +/−25 degrees horizontally and vertically in order to image this angular range with high fidelity on the fovea. As the eye executes this saccadic motion, the range of angles at which light strikes the spectacle lens depend on its refracting power and orientation with respect to the eye socket in ways that are straightforwardly computed from geometric optics.

The variation of visual response with angle depends on the geometry of the viewing situation as well as on the physiological and optical constraints imposed by the human eye. When viewing through spectacle lenses one can construct an angular function $S(\theta)$ that accounts for the distribution of cone pigments as well as normal saccadic eye movement. FIG. 2(*a*) shows a plot of the a real density of cones and rods for the human eye. The cones are heavily concentrated in a solid angle of less than 5 degrees. During normal vision, the eyeball moves in its socket at angles up to about 25 degrees from central fixation in saccadic movements. When viewing at more extreme angles, the natural physiological response is to initiate head movement. Saccadic movements allow the region of maximum photoreceptor sensitivity, the fovea, which subtends a small solid angle, to cover a wider range of angles without head movement. The foveal response and saccadic motion are then combined with the geometrical optics of a spectacle lens to produce $S(\lambda,\theta)$. As can be seen in FIG. 2(*b*), from each optical ray that enters the pupil there are corresponding locations and angles at both the retina and the surfaces of the ophthalmic lens. The angles with which light strikes the coated article and is subsequently imaged on the fovea over the range of saccadic eyeball motions is directly converted to the angular variation of $S(\lambda,\theta)$.

Figure 3:
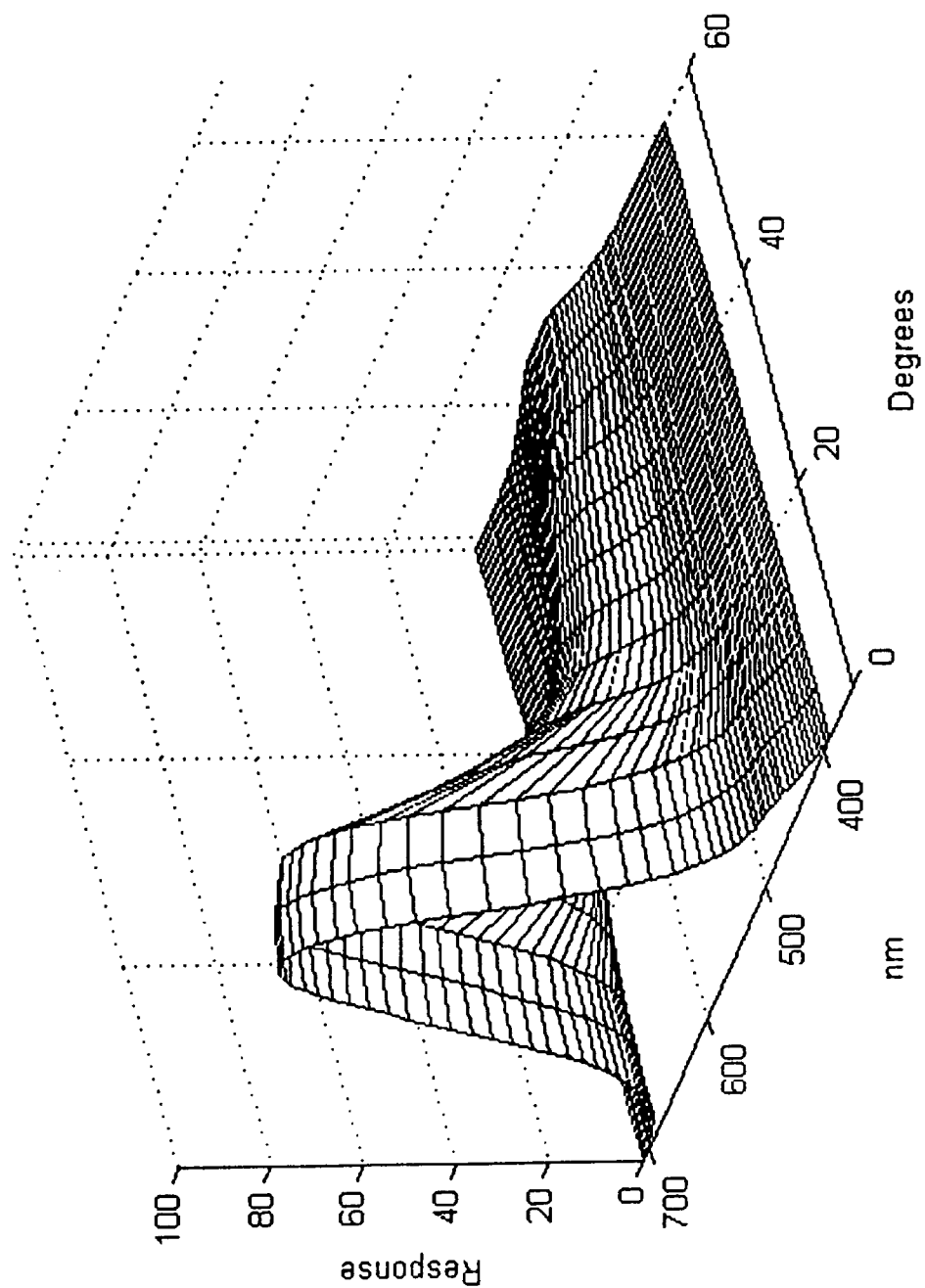
FIG. 3 is a plot of the human response function $S(\lambda,\theta)$ for an observer looking through a set of spectacle lenses as a function of viewing angle and optical wavelength. The wavelength dependent sensitivity is governed by the photopic retinal response, while the angular dependence is set by saccadic eye movement and the variation of cone density with angular separation from central fixation.

The visual response function $S(\lambda,\theta)$ shown in FIG. 3 combines the human response functions for wavelength and angle appropriate to viewing through a spectacle lens. The particular form of $S(\lambda,\theta)$ may vary in a manner consistent with the viewing conditions. For example, the rod photoreceptors are primarily active in low light conditions, resulting in an angular sensitivity that is dramatically different than for photopic vision, as can be inferred from the rod photoreceptor density shown in FIG. 2. The chromatic (wavelength-dependent) response of the rods is also different, having a maximum at 507 nm and a full-width at half maximum of 100 nm as described more fully in Wyszecki, p. 258 FIG. 4.3.2. Another example for use of different $S(\lambda,\theta)$ is obtained for humans with partial color blindness or retinal damage such as is caused by macular degeneration.

The angular component of $S(\lambda,\theta)$ also varies with the geometry of the optical viewing condition. When viewing reflections off of a monitor screen or a spectacle lens worn by another person, the angular variation of S depends on the geometric relationship between the observer, the coated article, and the position of the illumination source, rather than on the observer's saccadic eye movements. Similarly, the angular dependence of reflection from an automotive windshield will depend on its distance from the driver's head and its angle in the frame of the automobile. Although the coating materials, number of layers, and ordering of layers may be the same for two applications, say a windshield and a spectacle lens, the layer thicknesses computed for minimal Fa according to the invention may be different for each application.

Figure 4:
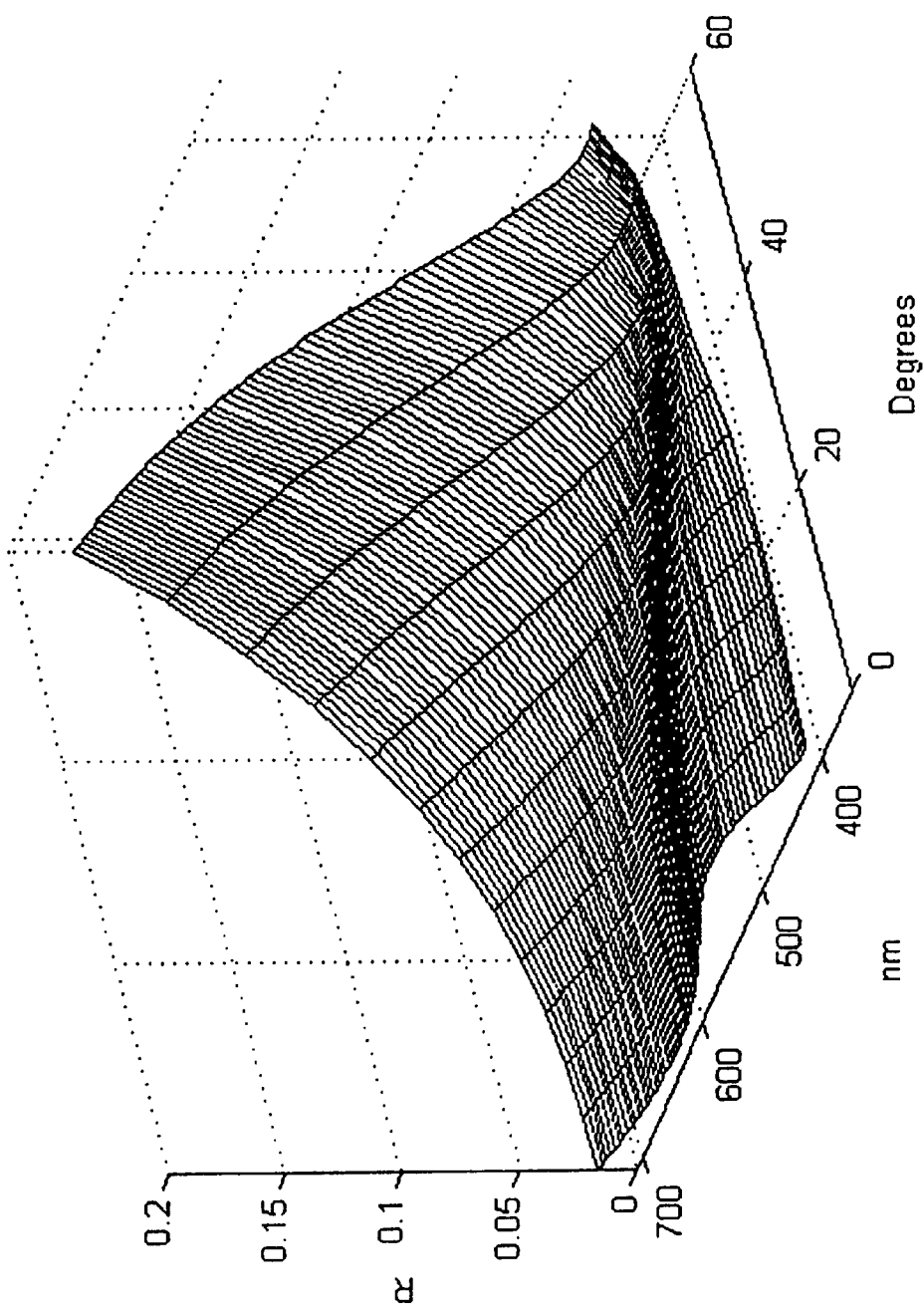
FIG. 4 is a plot of reflectance from a glass substrate coated with a three layer antireflection coating as described on page 110 of McLeod: 72.4 nanometers (nm) of PrO (n=192), 68.4 nm of TiO (n=2.06), and 100 nm of MgF (n=1.38). The perceived reflectance of this design is 141, or 24.5% of that for the uncoated glass substrate.

An example of the solution to the Fresnel equations using wavelengths between 390 and 710 nm and angles up to 60 degrees for a glass substrate coated with 72 nm of $PrO_2$ 68 nm of $TiO_x$, and 100 nm of MgF is shown in FIG. 4. This arrangement of layers and thicknesses is described as an anti-reflection (AR) coating in McLeod, op.cit., p. 110. The plot in FIG. 4 shows the average of s- and p-polarized reflectance, which is appropriate for human visual performance since human vision does not sense optical polarization. Changes to the substrate, the refractive properties of layers, or the order in which they are coated onto the substrate lead to complex but calculable changes in the reflectance $R(\lambda,\theta,P)$.

According to the present invention, the design of an AR coating is based on perceived reflectance. The perceived reflectance, F, of light from a surface by a human observer is defined as the integral of the product of the reflectance, $R(\lambda,\theta)$, with the human sensitivity function, $S(\lambda,\theta)$:

$$F = \iint S(\lambda,\theta) R(\lambda,\theta) d\lambda d\theta \qquad (7)$$

$R(\lambda,\theta)$ is the average of the p- and s- polarized reflectances and is used here because the human visual system is not sensitive to polarization. (In some cases, it is convenient to refer to the perceived reflectance of an uncoated article as "$F_{uncoated}$" or "$F_o$", and perceived reflectance of an AR coated substrate as "$F_{AR}$". (The latter is sometimes referred to as "F".) The value of F depends on the wavelength-dependent refractive indices of the substrate and layer media, on the thickness of the layers, and also on the angular and wavelength dependent visual response as described above.

In the ideal case, and as described in application Ser. No. 08/990,003, equation 7 is solved for the absolute minimum value of F (denoted $F_{min}$) for a given stack of coatings or layers on a substrate, for a given geometry of viewing conditions. The result is unique for the particular combination and composition of AR layers or coatings, the physical thickness of which are such that $F = F_{min}$. In an alternate embodiment, equation 7 is solved for a range of values close to, but not necessarily equal to, $F_{min}$. That is, good results are obtained when the value of F is small, but not necessarily an absolute minimum. In one such embodiment, the value of F for the coated substrate is within 25% of $F_{min}$, i.e., $F \leq$ to 1.25 $F_{min}$. For some applications, where extremely low amounts of perceived reflectance are desired, equation 7 is solved for values of F within 20%, 15%, or even 10% of $F_{min}$, i.e., $F \leq 1.20\ F_{min}$, $F \leq 1.15\ F_{min}$, or $F \leq 1.10\ F_{min}$. In each case, the solution to F enables one to identify the combination of physical thicknesses of layers of anti-reflection coatings that satisfy the desired range or value of F.

Figure 5:
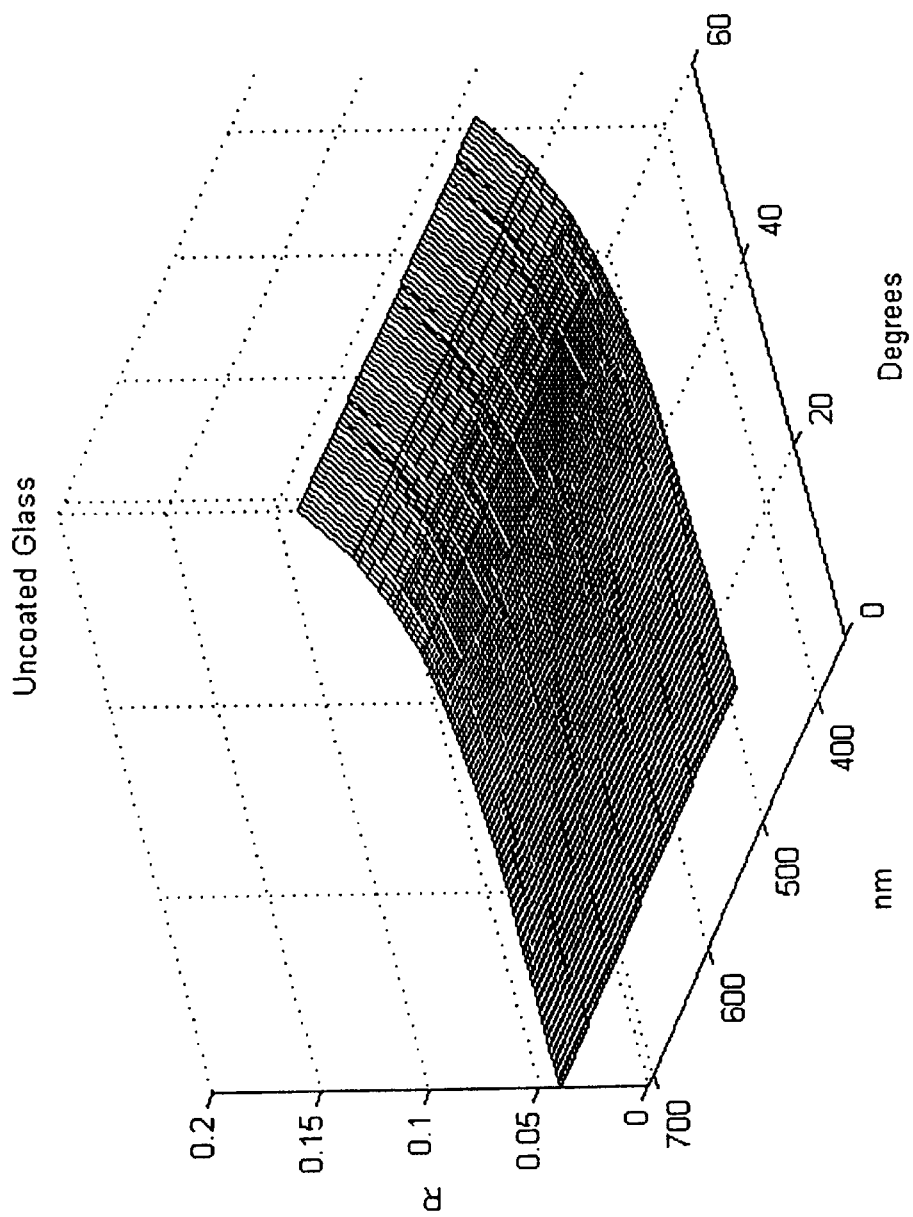
FIG. 5 is a plot of Fresnel reflectance from a single, uncoated glass surface (n(λ)=1.50) as a function of wavelength and angle computed by solution of equation 1. Although independent of wavelength, the amount of reflection increases from 4% at normal incidence to 9% at 60 degrees.

The following non-limiting examples are illustrative of the invention. Starting with the McLeod three-layer AR coating (FIG. 4) applied to a spectacle lens, one uses the response function shown in FIG. 3 and computes a baseline value of perceived reflectance F=141. The value of perceived reflectance from an uncoated glass lens (FIG. 5) has a value of 575 for the same $S(\lambda,\theta)$, and the McLeod design reduces the perceived reflection to 25% of that for the uncoated lens.

EXAMPLE 1

Figure 6A:
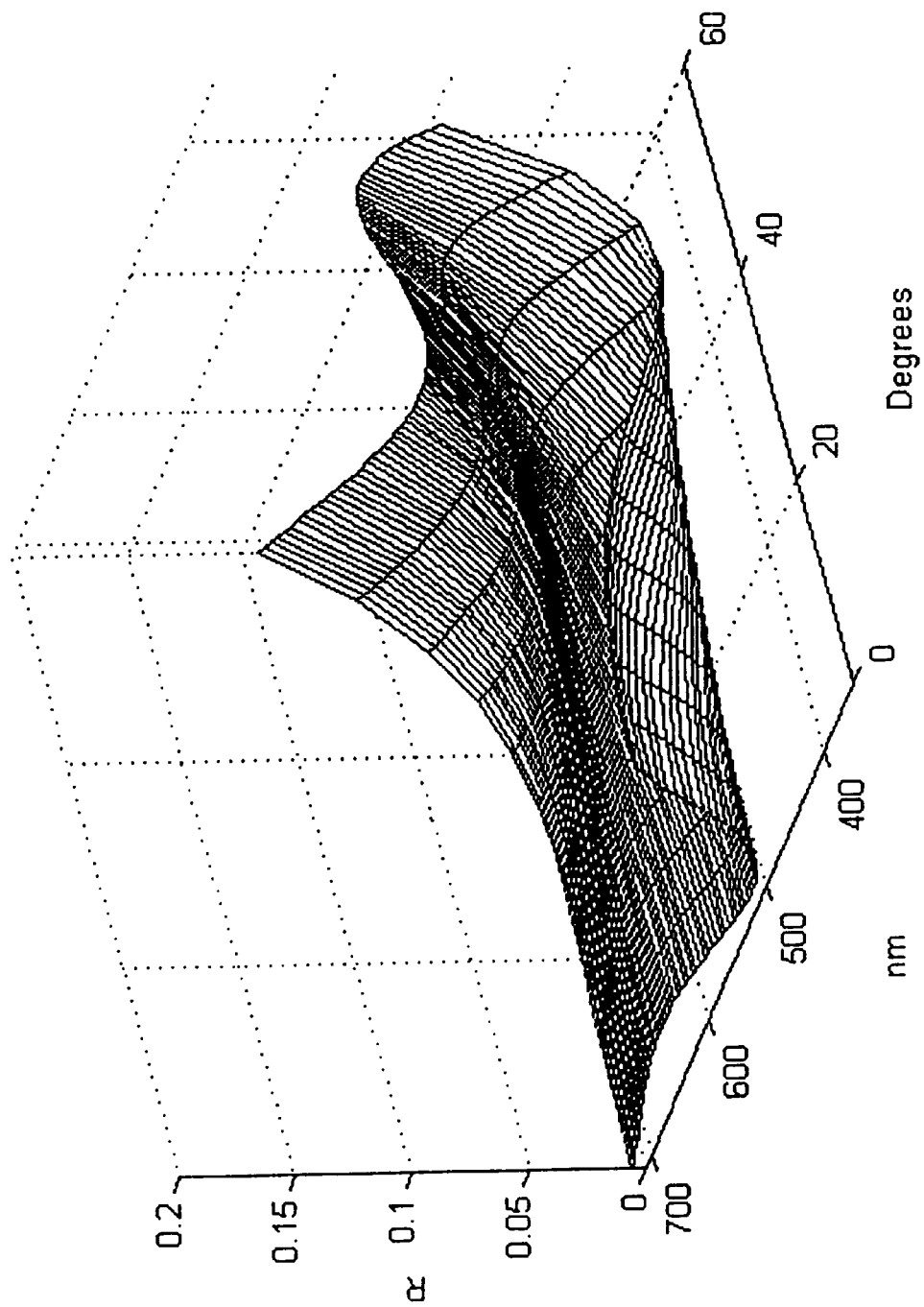
FIG. 6(a) is a plot of reflectance $R(\lambda,\theta)$ for the PrO:TiO:MgF coated glass article with minimal perceived reflectance using the response function shown in FIG. 3.
Figure 6B:
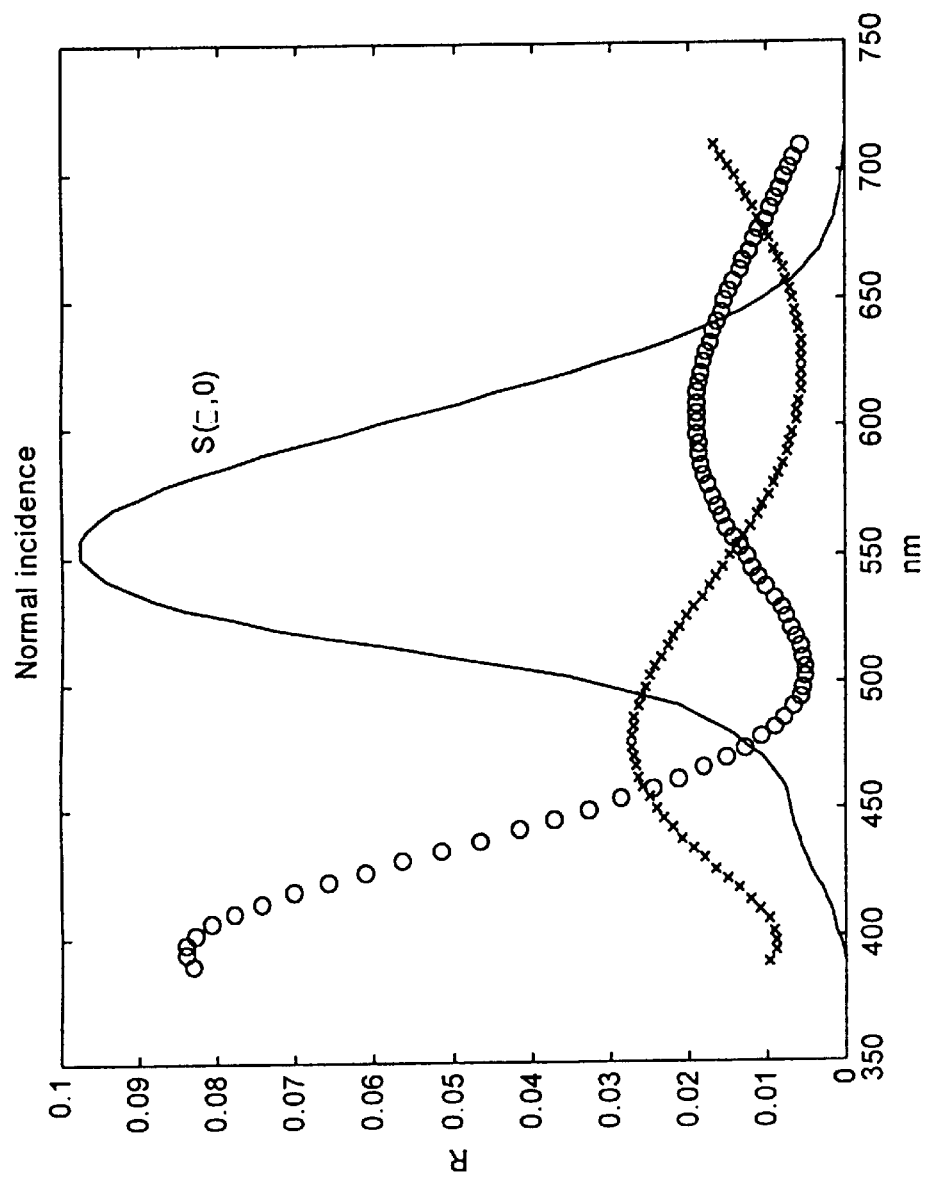
FIG. 6(b) is a comparison of $R(\lambda,\theta=0)$ for the articles of FIGS. 4 ("○") and 6(a) ("x"). The photopic response curve is also shown.

According to the present invention, the perceived reflectance, F, is computed for all combinations of layer thicknesses and the set of thicknesses for which F is minimized is selected. Beginning with the glass:PrO:TiO:MgF system described above, this calculation was performed and the minimum perceived reflectance $F_{min}$ was calculated to be 104, which is 18% that of the uncoated article and a 35% reduction from that of the textbook coating. This absolute minimum value of perceived reflectance (shown in FIG. 6) for these materials corresponds to the following physical thicknesses: 100 nm of PrO, 25 nm of TiO, and 87 nm of MgF.

EXAMPLES 2–19

Using the approach of the present invention, and solving equation 7 by altering the magnitude of physical thicknesses of the three layers in 10 nm increments, yielded over 16,000 combinations. Of these, eighteen were found to have perceived reflectances less than that of the textbook coating, in addition to the case where $F = F_{min}$ (Ex. 1). Twelve examples (plus Ex. 1) satisfy the desired parameter that $F \leq 1.25 F_{min}$. The results are presented in the following table:

TABLE I

Perceived Reflectance for Coated and Uncoated Spectable Lenses

| Coating | Thickness (nm) | | | F | % Improvement Over Uncoated[1] | % Within $F_{min}$[2] |
|---|---|---|---|---|---|---|
| | PrO | TiO | MgF | | | |
| Uncoated | 0 | 0 | 0 | 575 | 0% | 453% |
| Textbook | 73 | 68 | 100 | 140 | 311% | 35% |
| Ex. 1 ($F_{min}$) | 100 | 25 | 87 | 104 | 453% | 0% |
| Ex. 2 | 70 | 50 | 90 | 111 | 418% | 7% |
| Ex. 3 | 90 | 30 | 90 | 111 | 418% | 7% |
| Ex. 4 | 110 | 10 | 90 | 114 | 404% | 10% |
| Ex. 5 | 120 | 0 | 80 | 116 | 396% | 12% |
| Ex. 6 | 50 | 70 | 90 | 116 | 396% | 12% |
| Ex. 7 | 10 | 10 | 130 | 119 | 383% | 14% |
| Ex. 8 | 100 | 20 | 80 | 120 | 379% | 15% |
| Ex. 9 | 80 | 40 | 80 | 120 | 379% | 15% |
| Ex. 10 | 60 | 60 | 80 | 122 | 371% | 17% |
| Ex. 11 | 25 | 100 | 80 | 123 | 367% | 18% |
| Ex. 12 | 30 | 90 | 90 | 126 | 356% | 21% |
| Ex. 13 | 40 | 80 | 80 | 127 | 353% | 22% |
| Ex. 14 | 50 | 90 | 90 | 135 | 326% | 30% |
| Ex. 15 | 20 | 0 | 140 | 135 | 326% | 30% |
| Ex. 16 | 10 | 110 | 90 | 135 | 326% | 30% |
| Ex. 17 | 70 | 70 | 90 | 136 | 323% | 31% |
| Ex. 18 | 20 | 100 | 80 | 137 | 320% | 32% |
| Ex. 19 | 0 | 20 | 140 | 137 | 320% | 32% |

[1]% Improvement Over Uncoated = $(F_{uncoated}/F - 1)100$
[2]% Within $F_{min}$ = $(F/F_{min} - 1)100$ The thickness combinations reported in Table I do not preclude other combinations for which the value of F is within 25% (or some other desirably low percentage) of its minimum value of 104. However, of the 16000+ permutations that were examined, only Examples 1–13 were found to meet this criterion.

One skilled in the art will appreciate that equation 7 can be solved (for F, $F_{min}$, 1.25$F_{min}$, or any other desired value or range of F) using linear algebra and calculus. As an alternative to manual computation, linear algebra software can be used. Non-limiting examples of such software include Mathematica (Wolfram Research, Champaign-Urbana, Ill.), Matlab (The MathWorks, Inc., Natick, Mass.), Macsyma (Macsyma Inc., Arlington, Mass.), and Maple (Waterloo Maple, Inc., Waterloo, Ontario, Canada). Computational analysis of F is also possible using spreadsheet software, for example Excel (Microsoft, Redmond, Wash.) and Lotus 1-2-3 (Lotus Development Corp., Cambridge Mass.).

It will be apparent from Table I that discrete values of thicknesses were selected for each layer of material in computing F (namely, 10 nm intervals). One could, of course, choose a different interval, for example 5 nm, 2 nm, etc. In general, for small departures in the value of a given layer's physical thickness the effect on the computed value of F will also be small, and F will often lie within 25% of $F_{min}$. For example, the value of F corresponding to the layer thicknesses for PrO:TiO:MgF of 40, 80, and 80 nm, respectively, is 127 (Ex. 13 in Table I). The value of F corresponding to thicknesses 42, 80 and 80 nm, respectively, is 121, as is the value for a 40, 82, and 80 nm system. When the thicknesses are 40, 80, and 82 nm, F becomes 122. In each case, the value F is within 25% of $F_{min}$. However, when the thicknesses are set to 40, 80, and 78 nm, the value of F rises to 136, which is 31% higher than $F_{min}$.

Figure 7:
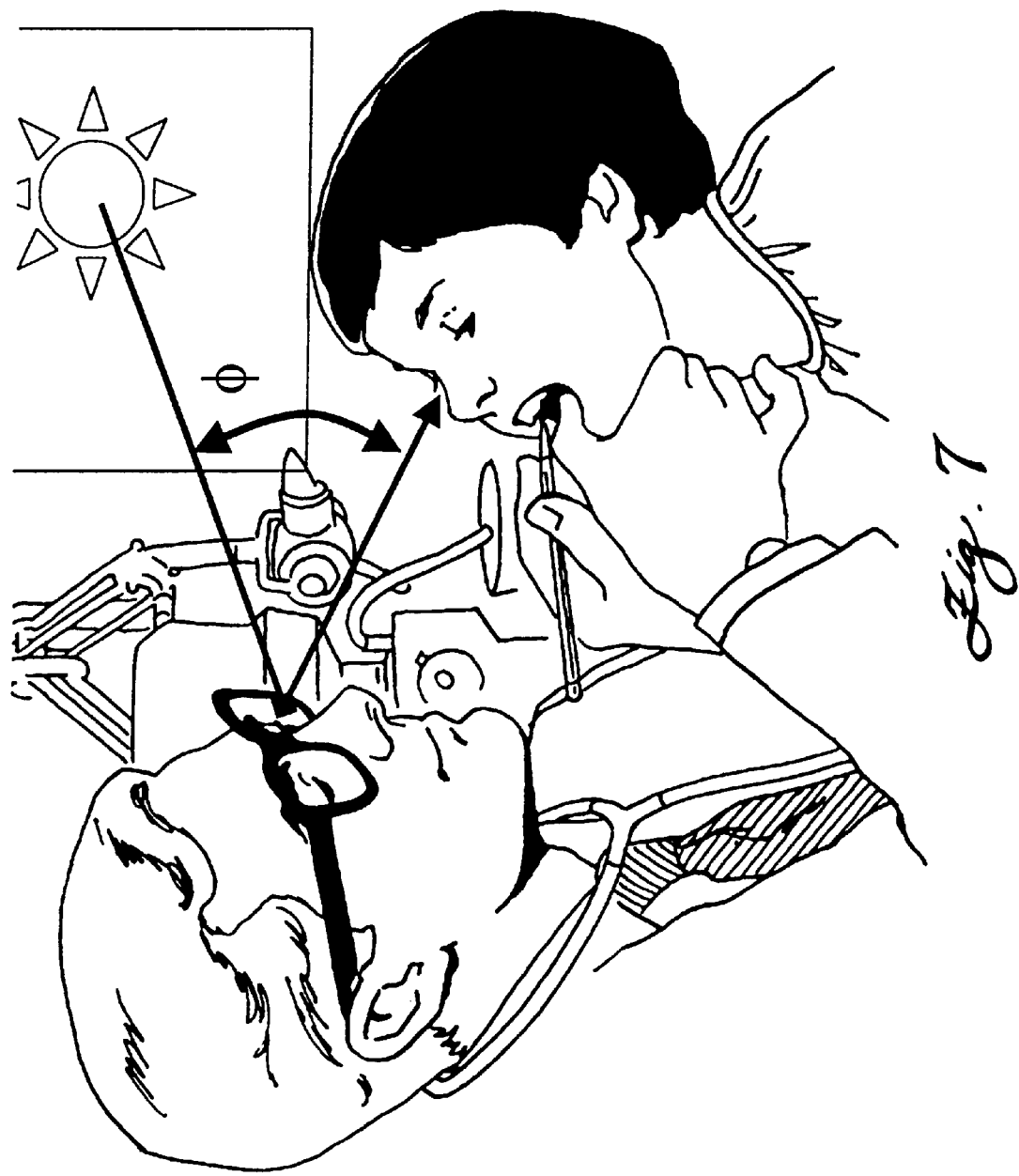
FIG. 7 is an illustration of the geometry for considering the color of light reflected from a spectacle lens at an angle φ and perceived by an observer, the child. The perceived color is computed using the wavelength dependent intensity of the source (sunlight filtered by window), the reflectance of the physician's coated spectacle lens ($R(\lambda,\theta)$), and the color response of the child observer.

A further aspect of the present invention concerns constraints on the perceived color of light reflected from the coated article. As an example of this embodiment we consider the AR coatings summarized in Table I from the point of view of an observer looking at a person wearing the spectacle lens. Light from overhead lamps, windows, or other sources of illumination strike the surface of the lens and are reflected into the eye of an observer at an angle ($\phi$) as shown schematically in FIG. 7. The color of this reflection depends on the wavelength-dependent intensity of the illuminant (sunlight filtered by the window), the wavelength and angle dependent reflectance of the coated article (the coated spectacle lens), and the physiology of color vision as described, for example, in Wandell, *Foundations of Vision*, Sinauer Associates:Sunderland Mass., 1995, or Wyszecki and Stiles op cit.

Figure 8:
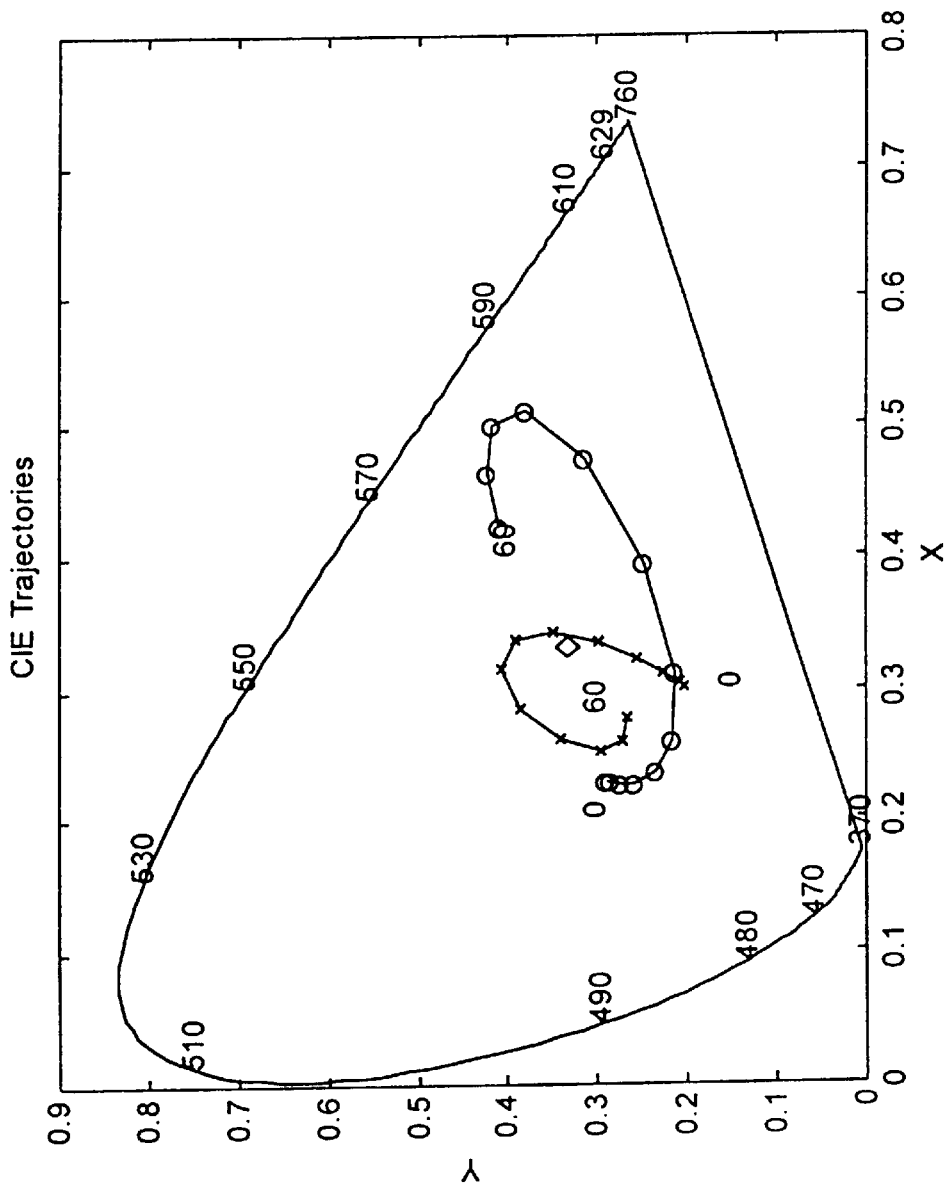
FIG. 8 is a plot of CIE color trajectories for the coatings shown in FIG. 2 ("x") and FIG. 4 ("○") from 0 to 60 degrees in 5 degree increments, presuming spectrally flat, broadband illumination such as is provided by a xenon arc lamp. The white point is shown by a diamond, and dominant wavelengths are shown at the boundary of the plot. To compute the dominate wavelength one extends a line from the white point through the computed CIE coordinate to the boundary. The point of intersection is the dominant wavelength.

The perceived color of an object is quantitatively defined by coordinates in color space such as the CIE 1931 or 1964 colorimetric coordinates or the uniform 1976 CIE ($L^*,u^*,v^*$) color space described in Wyszecki and Stiles in chapter 3. FIG. 8 shows the color coordinates (denoted="x") in the CIE 1931 representation for the McLeod textbook AR PrO:TiO:MgF coating as a function of angle for illumination by a xenon arc lamp. Also shown in FIG. 8 are the color coordinates (denoted "○") for the ($F_{min}$) minimal coating prepared in accordance with the present invention. The location marked by a diamond corresponds to white, that is, no perceived color. The dominant wavelength, which is defined as the wavelength at which a monochromatic stimulus produces the same perceived color, is found by tracing a line from the white point (diamond) to the periphery of the plot through the computed CIE color point. For example, both the textbook coating at a viewing angle of 50 degrees and the minimal $F_{min}$ coating at 0 degrees have a dominant wavelength of about 480 nm, that is, blue-green. Not all points in CIE color space have a dominant wavelength, however, the dominant wavelength provides a qualitative label with which to compare various hues.

Figure 9A:
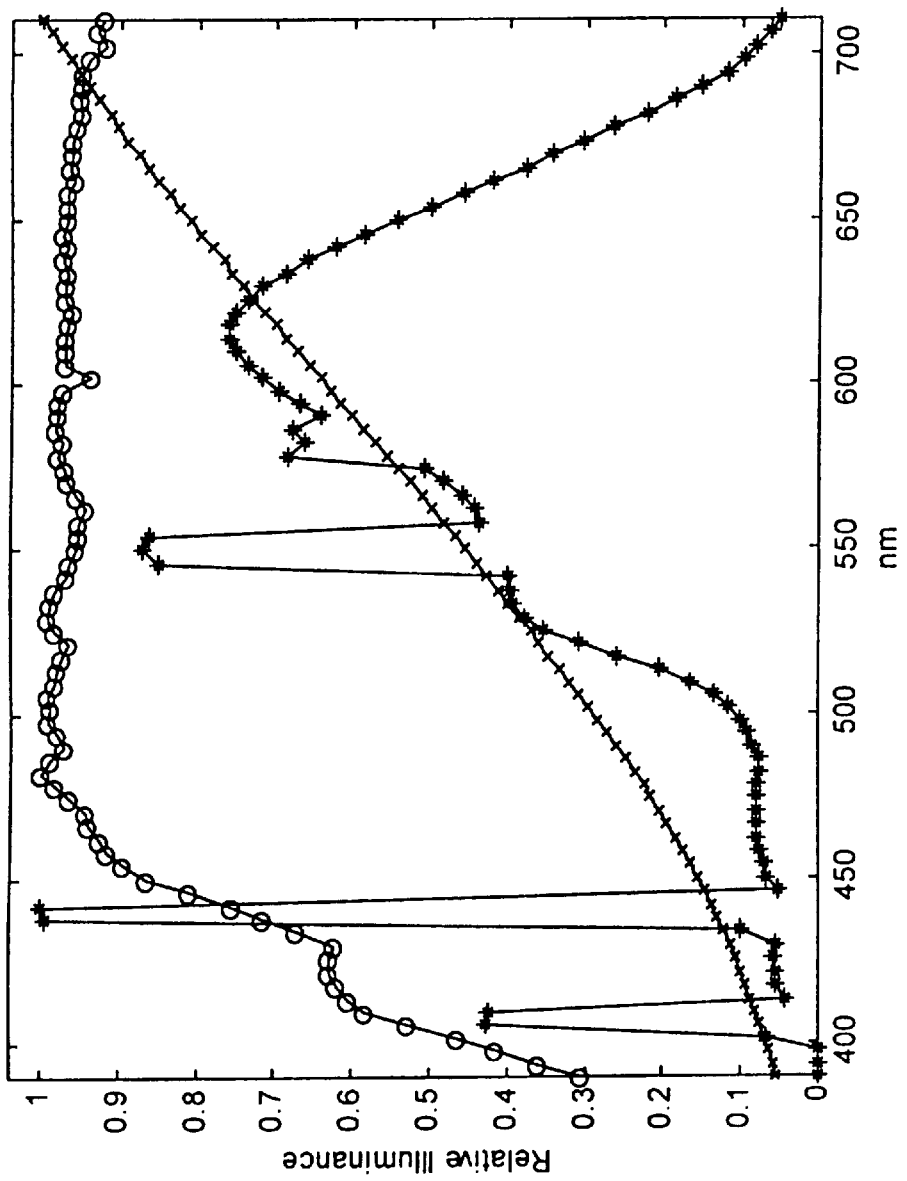
FIG. 9(a) is a plot of spectral irradiances of three typical light sources: daylight at sea level (○), an incandescent tungsten lamp (+), and a fluorescent lamp (*)
Figure 9B:
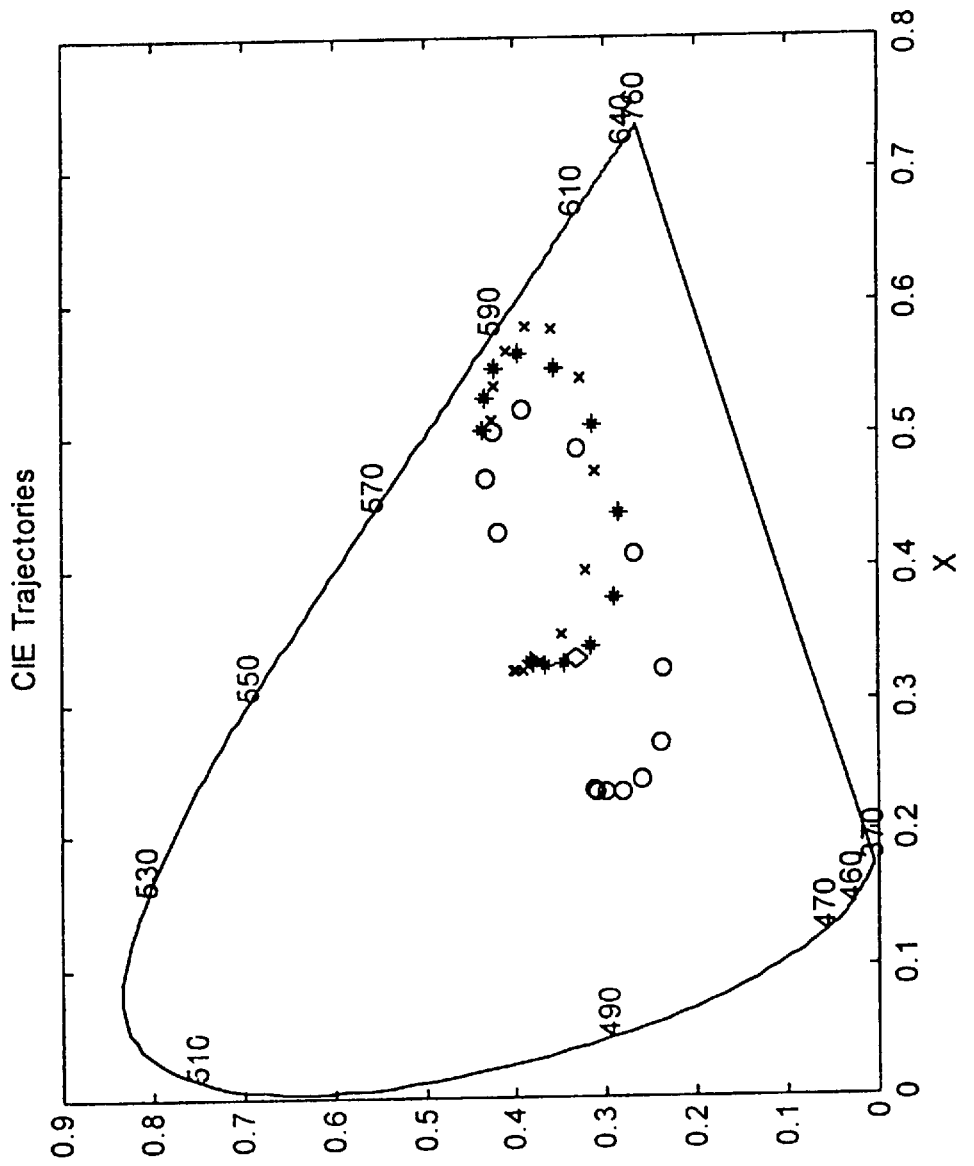
FIG. 9(b) is a plot of CIE Chromaticity coordinates for the coated article (Ex. 1, Table I for each of the three illuminants at angles from 0 to 60 degrees in 5 degree increments. Plotting symbols correspond to daylight at sea level (○), an incandescent tungsten lamp (+), and a fluorescent lamp (*).

The perceived color of light reflected from the surface of an AR coated article varies with both the angle of incidence and the source of illumination. FIG. 9(a) shows the spectra of three standard illuminats: daylight at sea level, an incandescent tungsten lamp, and a fluorescent lamp. The color coordinates for reflection of these lights from a coated article corresponding to Ex. 1 (Table 1, F=$F_{min}$) according to the present invention is shown in FIG. 9(b) for angles from 0 to 60 degrees in intervals of 5 degrees. The perceived color, as quantified by the CIE chromaticity coordinates, is a function of both the angle and the illuminant.

Both the actual location and the variation of CIE color location with angle are of practical interest for the design of AR coated articles. It is known to those practiced in the art of optometry that certain colors and hues are cosmetically preferable to others. Furthermore, the variation of hue with viewpoint is a factor in the cosmetic acceptance of a spectacle lens product. It is also clear from FIG. 1 that the absolute visual sensitivity for the reflected image is more acute for some wavelengths, say 550 nm (green) than for blue (450 nm) or deep red (750 nm). One of the advantages of the present invention is that it allows minimization of the reflectance perceived by a spectacle lens wearer (e.g. the physician in FIG. 7) while at the same time controlling the color of reflections perceived by an external observer (the child in FIG. 7).

Figure 10:
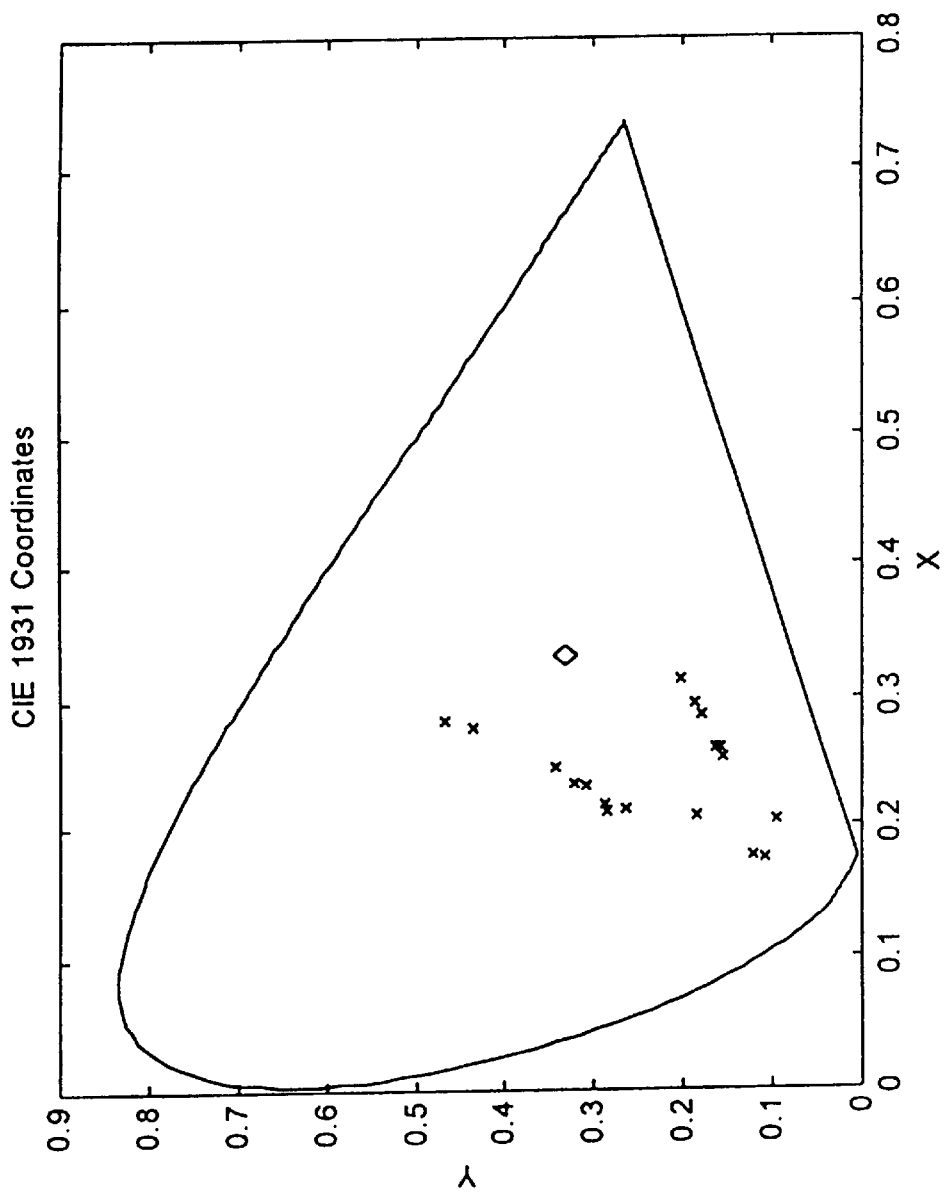
FIG. 10 is a plot of CIE (1931) chromaticity coordinates for examples listed in Table 1, for reflection of sunlight at normal incidence.
Figure 11:
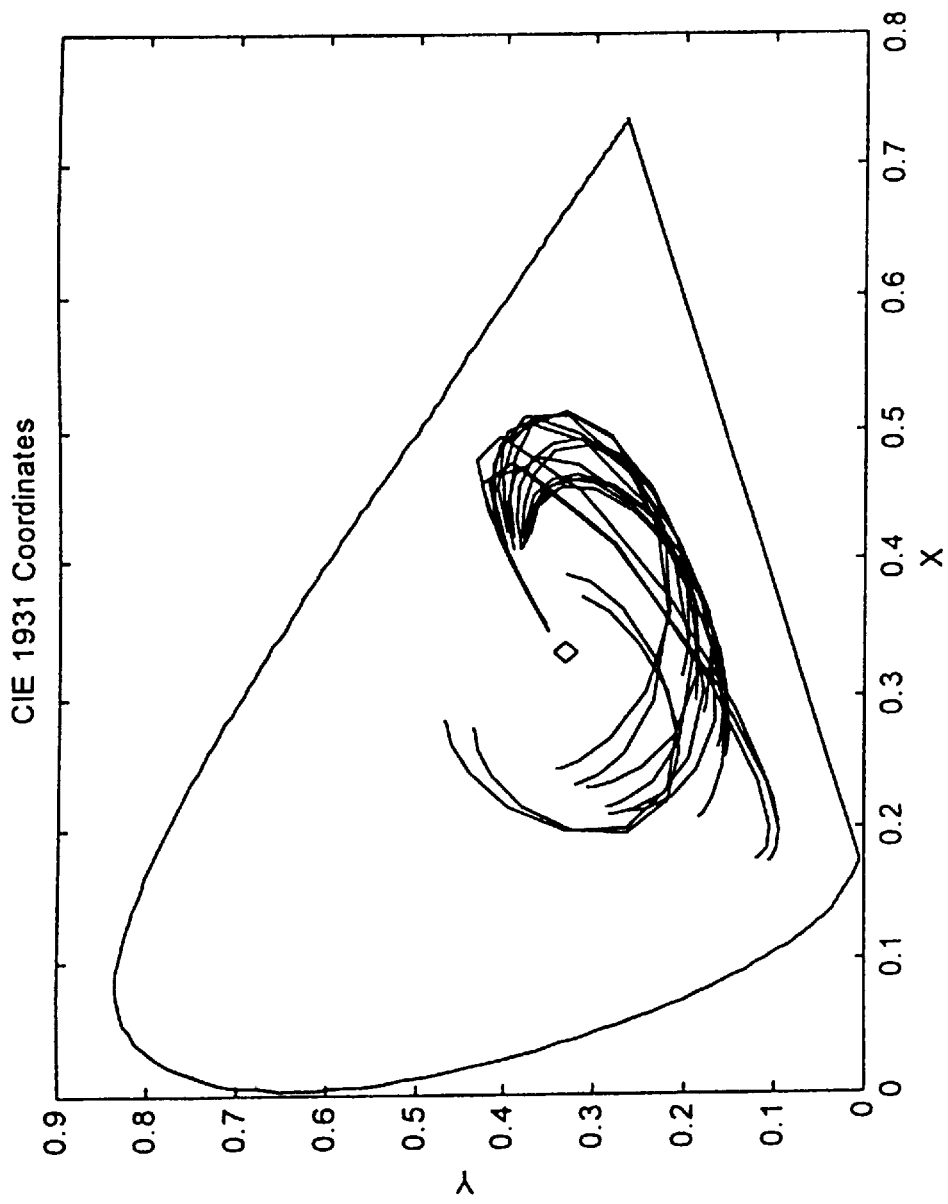
FIG. 11 is a plot of CIE trajectory for reflection from each of the 18 AR coatings for which F<140 at angles of incidence from 0 to 60 degrees. (Coating thicknesses shown in Table I).

FIG. 10 shows the perceived color for sunlight reflected from each of the Examples 2–19 summarized in Table I at normal incidence. As the angle between the illuminant, lens, and observer is increased, there is a shift in the perceived color as shown in FIG. 11, where the chromaticity coordinate trajectories are plotted in five degree intervals from 0 to 60 degrees. In one embodiment of the present invention, these calculated colors are used in connection with cosmetic or other color criteria to produce an article that has minimal perceived reflectance while maintaining a predefined color. For example, if one desires to minimize the appearance of the reflection one might match the hue to that of the wearer's skin color. Alternatively, one might constrain the color to within a range of hues that are minimally perceptible baed on their proximity to the white point or the photopic sensitivity toward blue or red hues implied by FIG. 1. In a third embodiment of color control one might elect the AR coating that has the smallest change in hue as it is tipped through a predetermined angular range under a predetermined source of illlumination. This range can be quantified by computing the length of the curves shown in FIG. 11 after the coordinates are transformed from the 1931 CIE color space to the 1976 CIE uniform ($L^*,u^*,v^*$) color space.

According to one aspect of the invention, the empirically determined average values of $S(\lambda,\theta)$ (see Wyszecki, Ch.5) are used to determine the preferred response factor to be used in designing an AR coating. However, construction of individual profiles for individuals with peculiar constraints on $S(\theta)$, such as would occur, for example, in individuals that are blind in one eye or that suffer from macular degeneration, are also encompassed by the invention.

The perceived reflectance, F, is numerically evaluated for one or more layers on an optical substrate as a function of the thickness, composition, and order in which they are coated on the substrate. The composition and order may be constrained by other material issues such as adhesion, surface energy, chemical resistance, etc. According to the present invention, the preferred thickness of the layer(s) in an AR coating brings the value of F to within 25% of its absolute minimum, subject to these constraints.

According to the present invention, the thickness of the layer(s) may also be constrained by the color perceived for light reflected from the article and into the eyes of an observer. This auxiliary optical constraint yields an AR coated article that is at once minimally reflective while having cosmetically desirable appearance.

EXAMPLES 20–30

Figure 12:
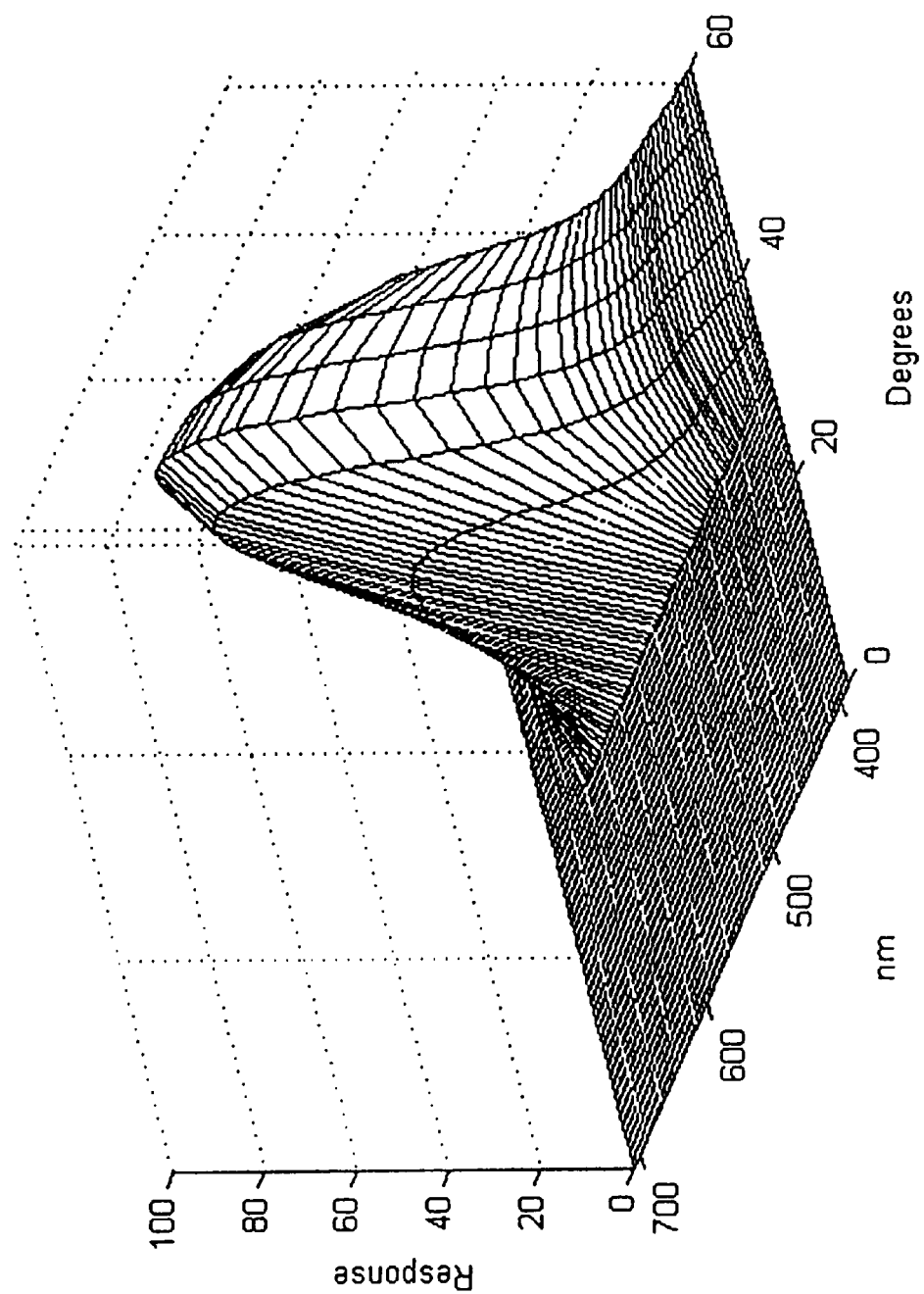
FIG. 12 is a plot of $S(\lambda,\theta)$ for a video display screen with light reflected by overhead illumination.
Figure 13:
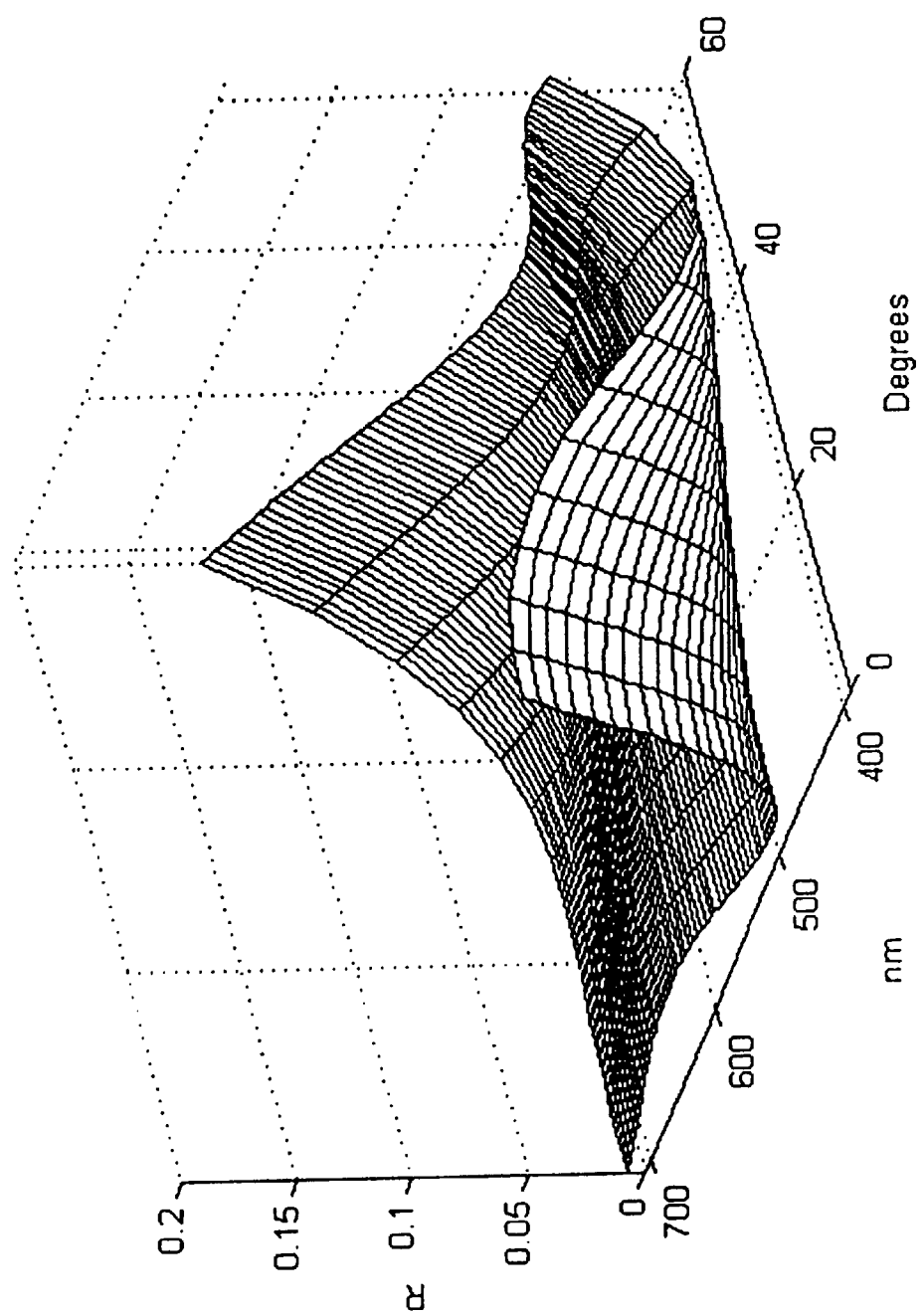
FIG. 13 is a plot of reflectance for the minimal F design of a three-layer PrO:TiO:MgF AR coating on a glass video display terminal.

A second embodiment of an AR coated article according to the present invention is a computer monitor or video screen that has a glass surface. Anti-reflection coatings for these articles are desirable because overhead or window illumination causes reflected images that impair the visibility of the images projected onto the display screen. The photopic response, $S(\lambda)$, for the human observer is as shown in FIG. 1. However, the angular component of $S(\lambda,\theta)$ is substantially different than for the spectacle lens. Presuming overhead illumination in a typical workplace environment, and using simple geometry, a sample $S(\lambda,\theta)$ is shown in FIG. 12. The perceived reflectance of the uncoated screen is 717, while that found for the textbook PrO:TiO:MgF coating is 258, or 36% of that for the uncoated display. Using the method described above, the layer thicknesses that reduce F to 191, its minimal value (26.6% that of the uncoated display), are found to be 60 nm PrO, 80 nm TiO, and 120 nm MgF. A plot showing $F_{min}$ for this embodiment is presented in FIG. 13.

It will be appreciated that this combination of layer thicknesses for these three materials is not ideal for the spectacle lens. Using the human response function for the spectacle lens (FIG. 3) leads to a value of F=252, substantially greater than even the textbook coating.

Figure 14:
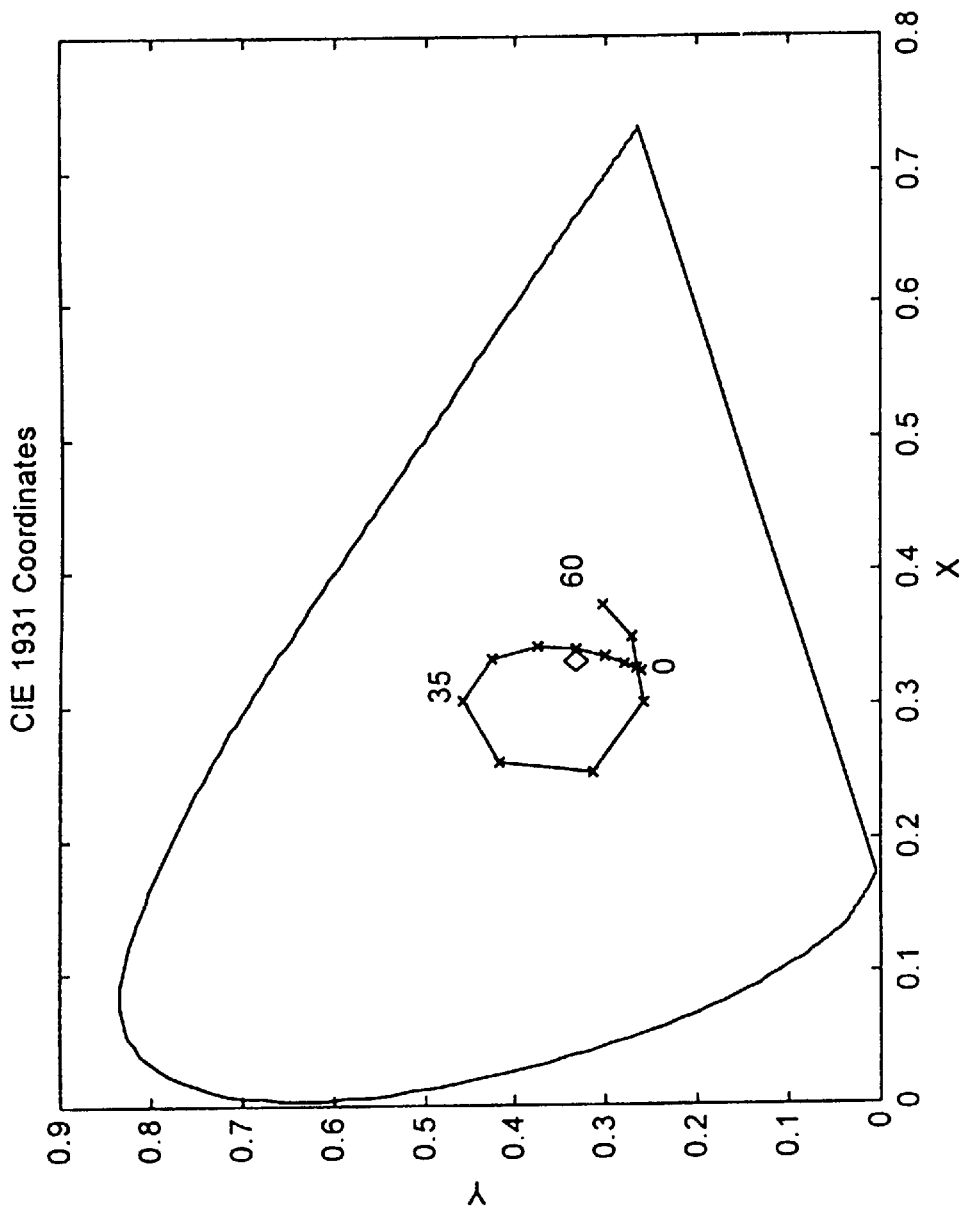
FIG. 14 is a plot of CIE chromatically coordinates for the video display with minimal F from 0 degrees to 60 degrees in 5 degree increments.

The chromaticity coordinates for this AR coated display terminal are shown in FIG. 14. As before, a series of computations is undertaken and yields values within a desired percentage of the minimum value of F, i.e., 25%, while the hue of the reflected light is separately computed for relevant angles using the colorimetry formulae. After evaluating the chromaticity coordinates of each design in Table II, the combination of hue and minimally perceived reflectance can be selected based on cosmetic or visual function constraints. For example, if the video display background is a preset color it is desirable to make the reflected hue blend with this background color to further reduce the reflections' visual impacts. It will be seen to those practiced in the art of vision science that the selection of particular hues for articles with F<1.25 Fmin will vary with illumination, the geometric optics of the display, and the color background of the environment in which the AR coated article is to be employed. Table II presents a partial set of the solutions to equation 7 for this AR coated display terminal, where computations were carried out by varying the magnitude of physical thicknesses of the layers in the 10 nm increments, yielding over 16,000 combinations. Of these, 165 had values of perceived reflectance within 30% of $F_{min}$, and approximately 125 had values of perceived reflectance within 25% of $F_{min}$. The results for the uncoated lens, the textbook (McLeod) coating, Ex. 20 ($F_{min}$), and Ex. 21–30 are presented below.

TABLE II

Perceived Reflectance for Coated and Uncoated Video Display Screens

| Coating | Thickness (nm) | | | F | % Improvement Over Uncoated[1] | % Within $F_{min}$[2] |
| --- | --- | --- | --- | --- | --- | --- |
| | PrO | TiO | MgF | | | |
| Uncoated | 0 | 0 | 0 | 717 | 0% | 273% |
| Textbook | 73 | 68 | 100 | 258 | 178% | 34% |
| Ex. 20 ($F_{min}$) | 60 | 80 | 120 | 192 | 273% | 0% |
| Ex. 21 | 70 | 70 | 120 | 193 | 272% | 1% |
| Ex. 22 | 50 | 90 | 120 | 193 | 272% | 1% |
| Ex. 23 | 50 | 90 | 130 | 201 | 257% | 5% |
| Ex. 24 | 100 | 30 | 120 | 201 | 257% | 5% |
| Ex. 25 | 90 | 40 | 120 | 201 | 257% | 5% |
| Ex. 26 | 60 | 90 | 130 | 211 | 240% | 10% |
| Ex. 27 | 130 | 10 | 130 | 220 | 226% | 15% |
| Ex. 28 | 50 | 100 | 140 | 230 | 212% | 20% |
| Ex. 29 | 20 | 140 | 130 | 240 | 199% | 25% |
| Ex. 30 | 100 | 50 | 120 | 240 | 199% | 25% |

[1]% Improvement Over Uncoated = ($F_{uncoated}/F - 1$)100
[2]% Within $F_{min}$ = ($F/F_{min} - 1$)100

It will be apparent to those practiced in the art of colorimetry that the perceived color depends quantitatively on the spectral distribution of the illuminant, as shown in FIGS. 9(A) and (B). Incandescent, fluorescent, and arc lamps have different spectral outputs than sunlight. Furthermore, the spectral content of sunlight varies with time of day and weather conditions. The present invention can incorporate the illuminant's spectral features into the computation of perceived reflectance or perceived color by including the wavelength dependent intensity of the source explicitly in the computation of $S(\lambda,\theta)$. One skilled in the art will appreciate that the details of which form or weighted average of forms should be applied will, of course, take into account the viewing conditions under which the article is to be employed.

The invention provides unique articles of manufacture, characterized by low reflectance. Generally, the articles are transparent, for example, ophthalmic lenses, windows, windshields, television and computer screens, etc. Transparent articles have no absorption of light over the region of the spectrum sensed by the human visual system, that is between about 350 and about 750 nm. In some embodiments, however, the article may be translucent. Translucent articles transmit light at some visible wavelengths but absorb some or all of the light at one or more visible wavelengths. Nonlimiting examples of translucent articles include tinted and shaded sunglasses, stained-glass windows, and tinted windshields.

In one embodiment, a transparent, low reflection article comprises an optical substrate and one or more layers of AR material.

It will be readily appreciated that low reflection articles having more than two layers of material deposited on an underlying optical substrate are also within the scope of the present invention.

The invention has been described in preferred and exemplary embodiments, but is not limited thereto. A variety of modifications, modes of operations and embodiments, all within the ability and skill of those skilled in the art, can be made without departing from the present invention. For example, the AR coatings and methods of designing and applying them can be used on a variety of optical substrates in addition to ophthalmic lenses. Even large articles, like automotive windshields, can be given an AR coating if a suitably large reactor is built.

All references herein are incorporated by reference as if set forth herein in their entirety. In both the text and the claims, use of the word "about" in relation to a range of numbers is intended to modify both the high and low values stated.

What is claimed:

1. A transparent or translucent coated article having a perceived reflectance F, wherein $F = \int\int S(\lambda,\theta)R(\lambda,\theta)d\lambda d\theta$ where $\lambda$ is wavelength, $\theta$ is incident angle, $S(\lambda,\theta)$ is human sensitivity function as a function of the wavelength and the incident angle, and $R(\lambda,\theta)$ is an average of p- and s-polarized reflectances, the coated article comprising:

an optical substrate; and one or more layers of anti-reflection material coated on at least a portion of the optical substrate, said one or more layers of anti-reflection material having a thickness such that the perceived reflectance of the coated article is less than or equal to $1.25F_{min}$, where $F_{min}$ is a minimized perceived reflectance of the coated article.

2. An article as recited in claim 1, wherein the optical substrate is an ophthalmic lens.

3. An article as recited in claim 2, wherein the ophthalmic lens is coated with the anti-reflection material on at least a portion of one or both lens surfaces and/or its edge.

4. An article as recited in claim 1, wherein the optical substrate is a window.

5. An article as recited in claim 1, wherein the optical substrate is a television screen or computer monitor.

6. A coated article as recited in claim 1, wherein at least one layer of anti-reflection material comprises a fluorocarbon film.

7. An article as recited in claim 6, wherein the fluorocarbon film is a plasma deposition product of a perfluorinated organic compound.

8. An article as recited in claim 7, wherein the perfluorinated organic compound is a perfluoroaliphatic or perfluorocycloaliphatic compound.

9. An article as recited in claim 8, wherein the perfluorinated organic compound is selected from the group consisting of perfluorocyclobutane, hexafluoroethane, tetrafluoroethylene, perfluoropropene, and mixtures thereof.

10. An article as recited in claim 6, wherein the fluorocarbon film comprises polytetrafluoroethylene.

11. A coated article as recited in claim 1, wherein at least one layer of anti-reflection material comprises an organic or organosilicon film.

12. A coated article as recited in claim 1, wherein at least one of layer of anti-reflection material comprises a plasma-enhanced chemical vapor deposition product of one or more precursors selected from the group consisting of $Si(CH_3)_4$, $HSi(CH_3)_3$, thiophene, furan, benzene, $Ti(OC_2H_5)_4$, $Ti(OC_3H_7)_4$, $Ti(N(C_2H_5)_2)_4$, and perfluorinated organic compounds.

13. An article as recited in claim 1, wherein each layer of anti-reflection material has a physical thickness greater than about 5 nm and less than about 1 micron.

14. An article as recited in claim 1, further comprising an optically thin metal layer deposited on the optical substrate and/or on a layer of anti-reflection material.

15. An article as recited in claim 1, further comprising a layer of hydrophobic material.

16. A coated article as recited in claim 1, having a color, when viewed at a specified angle or angles, under a specified illumination, that is perceived to lie within a specified volume element of color space defined by the color's CIE chromaticity coordinates.

17. An article as recited in claim 16, where the illumination is selected from normal or spectrally filtered daylight, tungsten lamps, fluorescent lamps, and arc lamps.

18. An article as recited in claim 16, where the volume element is defined by a circle of radius 0.1 centered at (1/3, 1/3) in 1931.

19. An article as recited in claim 16, where the volume element is selected to match a background color and thereby decrease the visibility of reflected light.

20. A method for making a transparent or translucent coated article in which an optical substrate is coated with one or more layers of anti-reflection material, said coated article having a perceived reflectance F, wherein $F=\int\int S(\lambda,\theta)R(\lambda,\theta)d\lambda d\theta$ where $\lambda$ is wavelength, $\theta$ is incident angle, $S(\lambda,\theta)$ is human sensitivity function as a function of the wavelength and the incident angle, and $R(\lambda,\theta)$ is an average of p- and s-polarized reflectances, the method comprising:
  initiating deposition of one or more layers of anti-reflection material on the substrate; and
  terminating deposition when said one or more layers reach a desired thickness such that the perceived reflectance of the coated article is less than or equal to $1.25F_{min}$, where $F_{min}$ is a minimum perceived reflectance of the coated article.

21. The method of claim 20, wherein the layer is deposited by plasma-enhanced chemical vapor deposition.

* * * * *

UNITED STATES PATENT AND TRADEMARK OFFICE
CERTIFICATE OF CORRECTION

PATENT NO.    : 6,172,812 B1
DATED         : January 9, 2001
INVENTOR(S)   : Peter D. Haaland and B. Vincent McKoy It is certified that error appears in the above-identified patent and that said Letters Patent is hereby corrected as shown below:

<u>Column 13,</u>
Line 14, after "one" delete "of".

Signed and Sealed this

Twenty-seventh Day of August, 2002

Attest:

Attesting Officer

JAMES E. ROGAN
*Director of the United States Patent and Trademark Office*